(12) United States Patent
Jeong et al.

(10) Patent No.: US 9,543,525 B2
(45) Date of Patent: Jan. 10, 2017

(54) ORGANIC LIGHT EMITTING DEVICE AND DISPLAY APPARATUS INCLUDING THE SAME

(71) Applicant: SAMSUNG DISPLAY CO., LTD., Yongin, Gyeonggi-Do (KR)

(72) Inventors: Hyein Jeong, Suwon-si (KR); Jungsub Lee, Bucheon-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/605,260

(22) Filed: Jan. 26, 2015

(65) Prior Publication Data

US 2016/0028019 A1    Jan. 28, 2016

(30) Foreign Application Priority Data

Jul. 24, 2014    (KR) .................. 10-2014-0094180

(51) Int. Cl.
*H01L 51/00*    (2006.01)
*H01L 27/32*    (2006.01)
*H01L 51/50*    (2006.01)

(52) U.S. Cl.
CPC ......... *H01L 51/0058* (2013.01); *H01L 51/006* (2013.01); *H01L 51/0052* (2013.01); *H01L 51/0059* (2013.01); *H01L 51/0067* (2013.01); *H01L 51/0072* (2013.01); *H01L 27/3244* (2013.01); *H01L 51/0081* (2013.01); *H01L 51/5096* (2013.01)

(58) Field of Classification Search
CPC . C07D 209/88; C08G 61/122; H01L 51/5293; H01L 27/32; H01L 2251/55; H01L 51/0006; H01L 51/0067; H01L 51/0085; H01L 51/5072; H01L 51/0072; H01L 51/5096; H01L 51/0081; H01L 51/5092
USPC ............................................. 257/87
See application file for complete search history.

(56) References Cited

U.S. PATENT DOCUMENTS

| | | | |
|---|---|---|---|
| 2002/0057050 A1* | 5/2002 | Shi .................. | C07C 211/54 313/504 |
| 2009/0134384 A1* | 5/2009 | Stoessel ............ | C07F 5/025 257/40 |
| 2013/0153865 A1 | 6/2013 | Kho et al. | |
| 2014/0034927 A1* | 2/2014 | Seo .................. | H01L 51/504 257/40 |
| 2015/0340619 A1* | 11/2015 | Pflumm ............ | C09K 11/06 257/40 |
| 2015/0349285 A1* | 12/2015 | Seo .................. | H01L 51/5044 257/40 |

FOREIGN PATENT DOCUMENTS

| | | |
|---|---|---|
| JP | 2005-530320 | 10/2005 |
| JP | 2011-238922 | 11/2011 |
| KR | 10-2012-0112672 | 10/2012 |
| KR | 10-2014-0038925 | 3/2014 |

* cited by examiner

*Primary Examiner* — Caridad Everhart
(74) *Attorney, Agent, or Firm* — Lee & Morse, P.C.

(57) ABSTRACT

An organic light emitting device includes an anode, a hole auxiliary layer on the anode, the hole auxiliary layer including an arylamine derivative, an emission layer on the hole auxiliary layer, an electron auxiliary layer on the emission layer, the electron auxiliary layer including a 9,10-diarylanthracene derivative and a bifluorene derivative, and a cathode on the electron auxiliary layer.

20 Claims, 4 Drawing Sheets

ORGANIC LIGHT EMITTING DEVICE AND DISPLAY APPARATUS INCLUDING THE SAME

CROSS-REFERENCE TO RELATED APPLICATION

Korean Patent Application No. 10-2014-0094180, filed on Jul. 24, 2014, in the Korean Intellectual Property Office, and entitled: "Organic Light Emitting Device and Display Apparatus Including the Same," is incorporated by reference herein in its entirety.

BACKGROUND

1. Field

Embodiments relate to an organic light emitting device and a display apparatus including the same.

2. Description of the Related Art

Flat display apparatuses may be classified as a light emitting type device and a light receiving type device. The light emitting type device may include a flat cathode ray tube, a plasma display panel, an organic light emitting device (OLED), etc. The OLED is a self-luminous display apparatus having merits such as a wide viewing angle, excellent contrast, and a rapid response time.

Therefore, the OLED may be applied in a display apparatus for a mobile apparatus including a digital camera, a video camera, a camcorder, a personal digital assistant, a smart phone, an ultra slim laptop, a tablet personal computer, a flexible display apparatus, etc. or a large-sized electronic and electric product such as an ultra slim television and is highly favored.

The OLED displays color based on the principle of recombining of holes and electrons injected in an anode and a cathode in an organic emission layer and emitting light. Excitons obtained by the combination of the injected holes and electrons emit light while being dropped from an excited state to a ground state.

SUMMARY

Embodiments are directed to an organic light emitting device including an anode, a hole auxiliary layer on the anode, the hole auxiliary layer including an arylamine derivative, an emission layer on the hole auxiliary layer, an electron auxiliary layer on the emission layer, the electron auxiliary layer including a 9,10-diarylanthracene derivative and a bifluorene derivative, and a cathode on the electron auxiliary layer.

A weight ratio of the 9,10-diarylanthracene derivative to the bifluorene derivative may be from about 7:3 to about 3:7.

The hole auxiliary layer may include an arylamine represented by the following Formula 1:

[Formula 1]

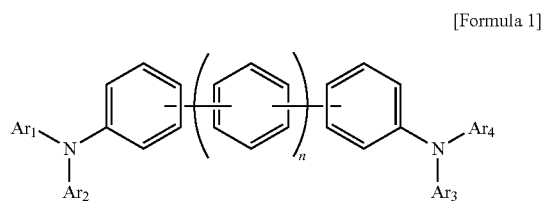

where $Ar_1$ to $Ar_4$ are independently a substituted or unsubstituted aryl group having 6 to 30 carbon atoms, a substituted or unsubstituted heteroaryl group having 2 to 30 carbon atoms, or a substituted or unsubstituted polycycloaryl group having 2 to 30 carbon atoms, and n is an integer from 2 to 4.

The arylamine may be at least one compound represented by H-01 to H-15 in the following Formula 2:

[Formula 2]

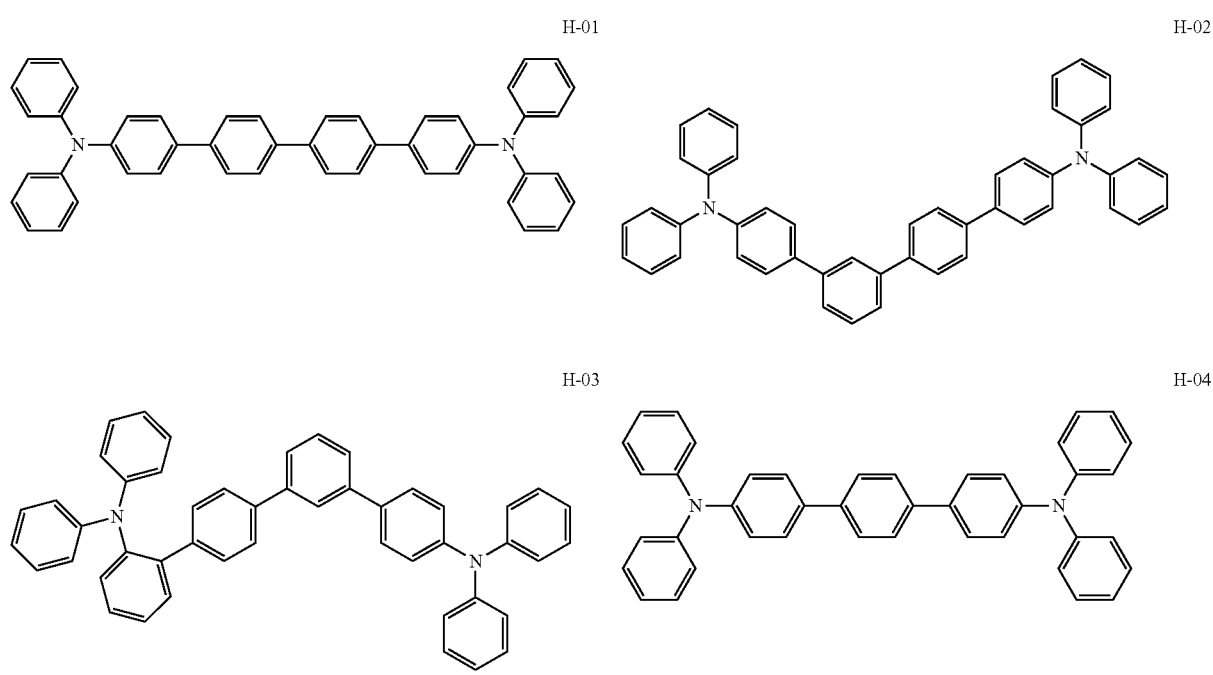

-continued
H-05
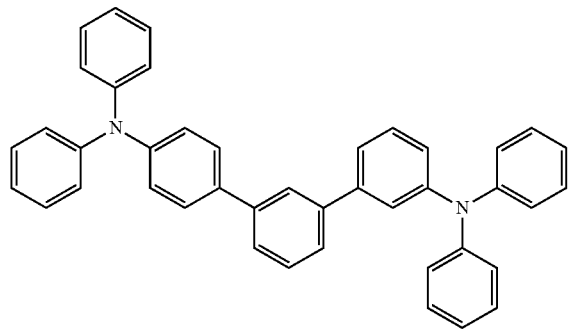
H-06
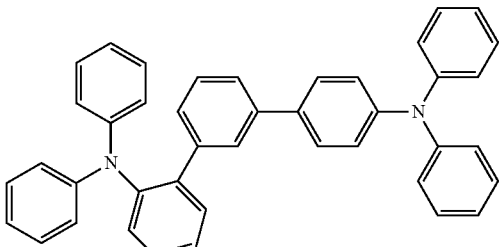
H-07
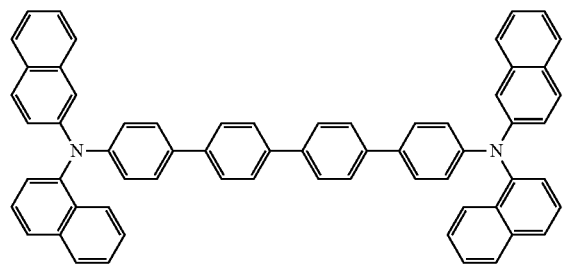
H-08
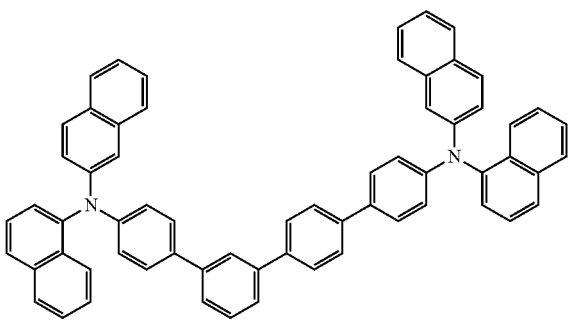
H-09
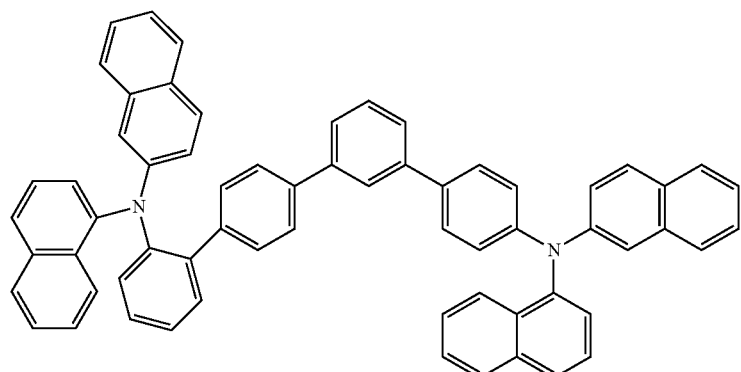
H-10
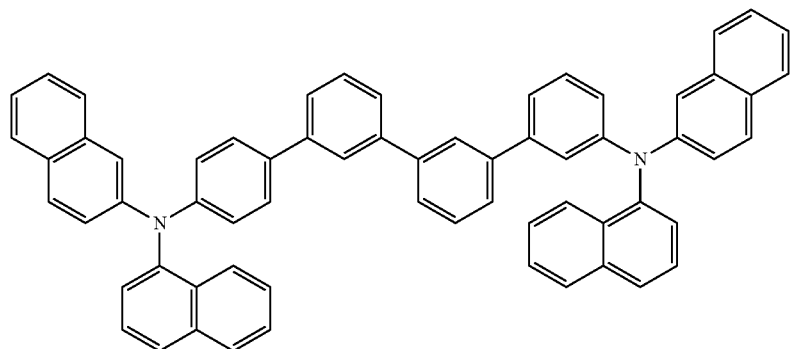

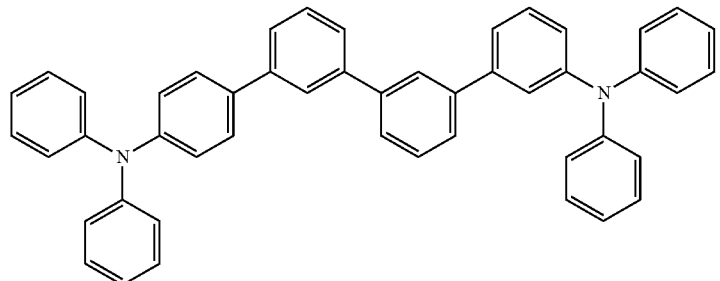
H-11
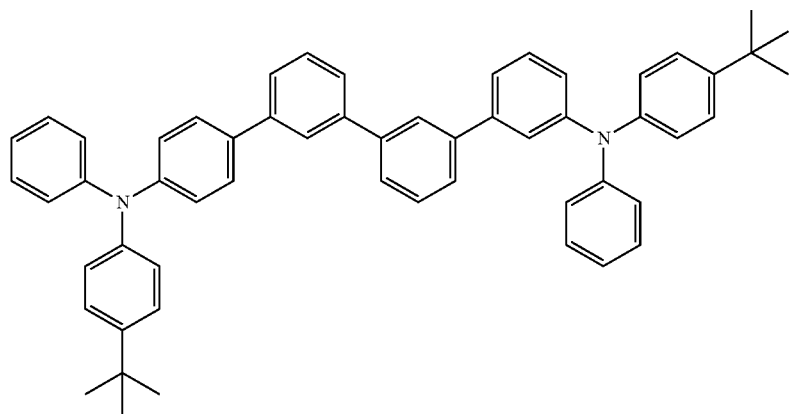
H-12
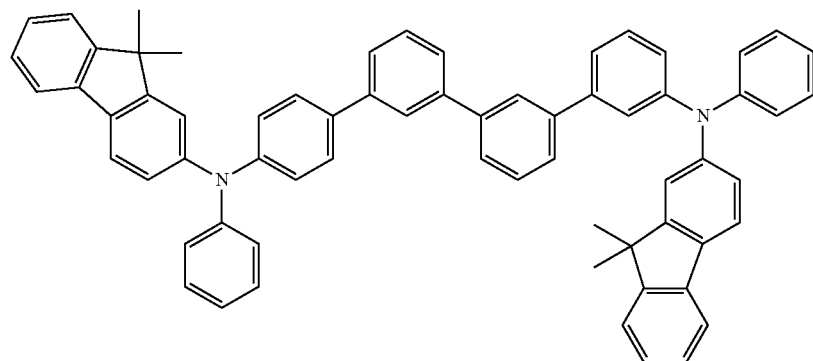
H-13
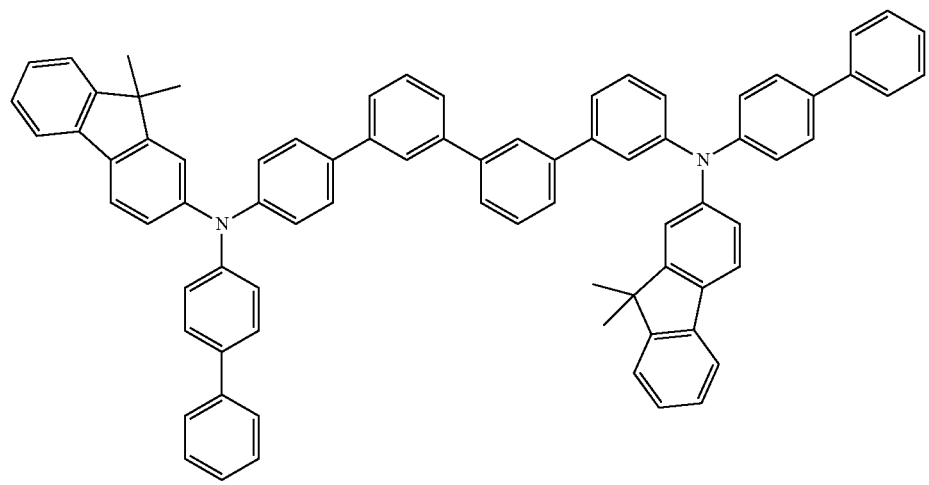
H-14

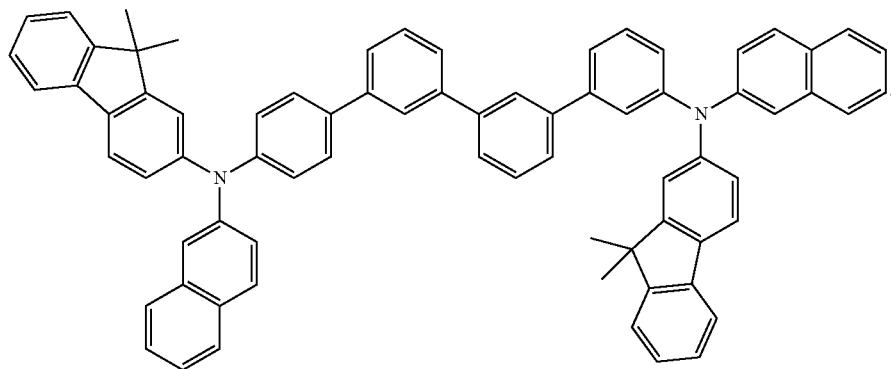
H-15

The 9,10-diarylanthracene derivative may be represented by the following Formula 3:

[Formula 3]

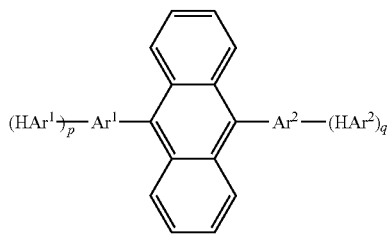

where $Ar^1$ is a substituted or unsubstituted phenylene group,
$Ar^2$ is a substituted or unsubstituted phenylene group or naphthalene group,
$HAr^1$ and $HAr^2$ are a substituted or unsubstituted pyridinyl group, quinolinyl group, or isoquinolinyl group,
p and q are independently an integer from 0 to 3, and
if p or q is at least 2, the respective groups $HAr^1$ or $HAr^2$ are the same or different.

The 9,10-diarylanthracene derivative may be at least one compound represented by E1 to E9 in the following Formula 4:

[Formula 4]

E1
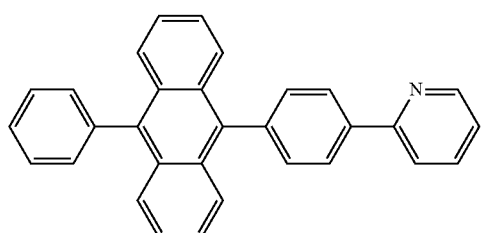

E2
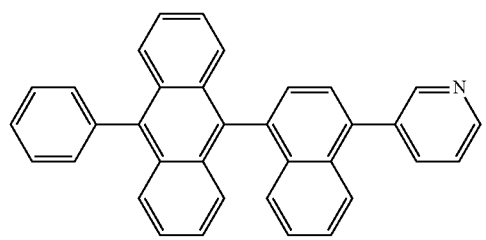

E3
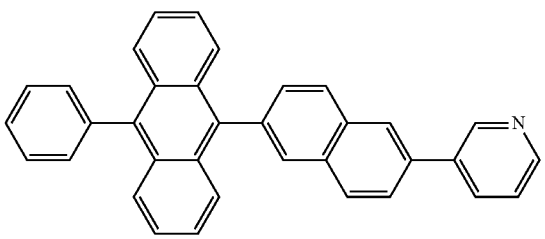

E4
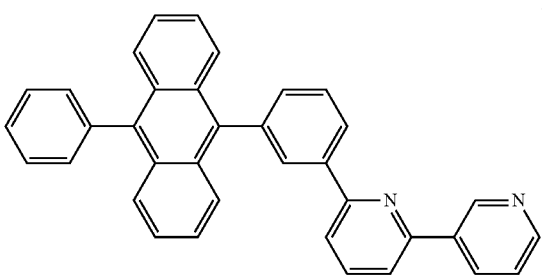

E5
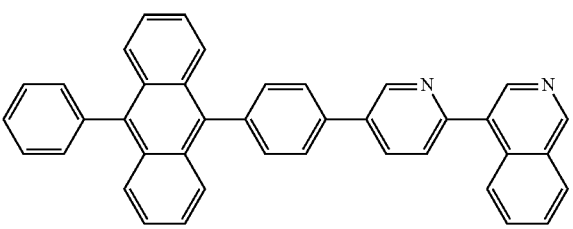

-continued

E6
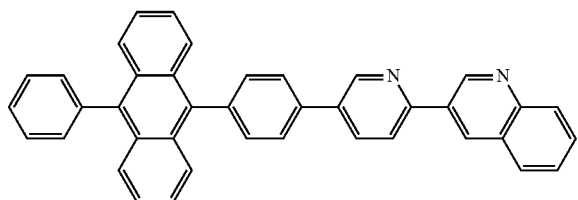

E7
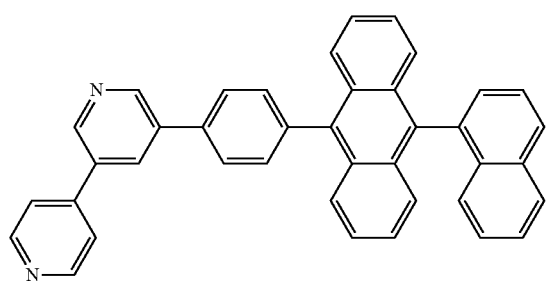

E8
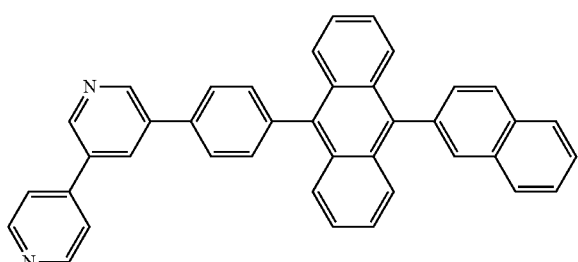

E9
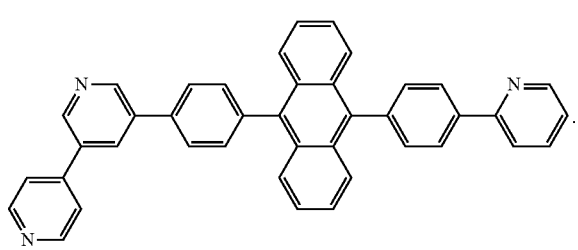

The bifluorene derivative may be represented by the following Formula 5:

[Formula 5]
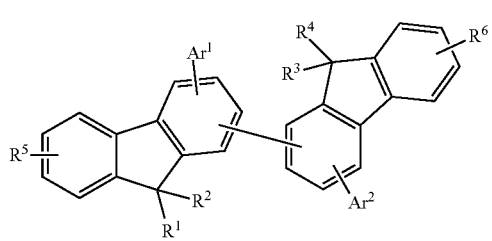

where $R^1$ to $R^6$ are independently hydrogen, deuterium, a halogen group, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted cycloalkyl group having 3 to 30 carbon atoms, a substituted or unsubstituted alkoxy group having 1 to 30 carbon atoms, a substituted or unsubstituted aryloxy group having 6 to 30 carbon atoms, a substituted or unsubstituted arylthiol group having 6 to 30 carbon atoms, a substituted or unsubstituted aryl group having 6 to 30 carbon atoms, a substituted or unsubstituted heteroaryl group having 2 to 30 carbon atoms, a substituted or unsubstituted amine group having 1 to 30 carbon atoms, a substituted or unsubstituted silyl group, a cyano group, a nitro group, a hydroxyl group, a carboxyl group, or a combination thereof, and $Ar^1$ and $Ar^2$ are independently hydrogen, deuterium, a halogen group, a substituted or unsubstituted alkyl group having 1 to 30 carbon atoms, a substituted or unsubstituted aryl group having 6 to 30 carbon atoms, a substituted or unsubstituted heteroaryl group having 2 to 30 carbon atoms, a substituted or unsubstituted amine group having 1 to 30 carbon atoms, or a combination thereof.

The bifluorene derivative may be at least one compound represented by T-1 to T-9 in the following Formula 6:

[Formula 6]

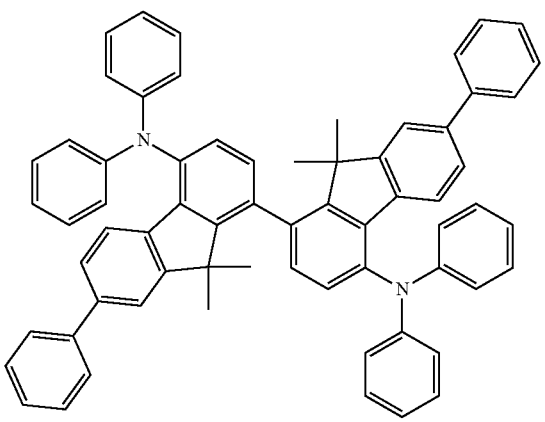

T-1

T-2

T-3
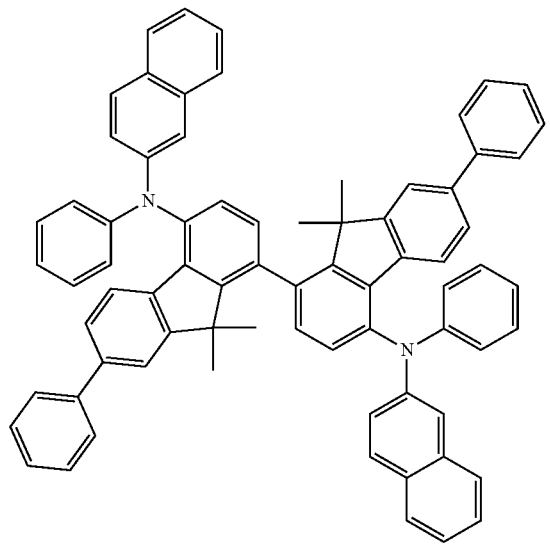
T-4
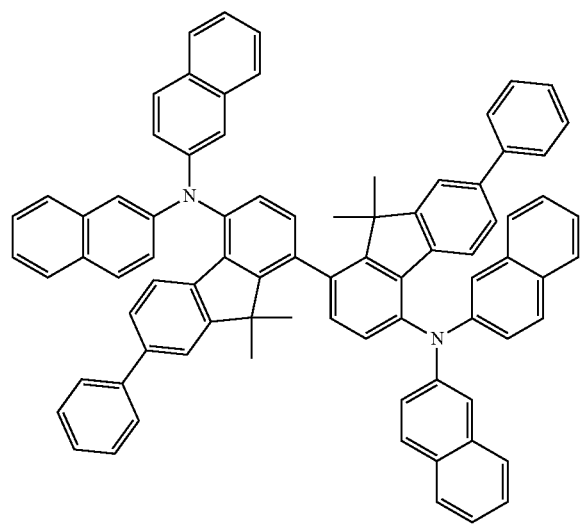
T-5
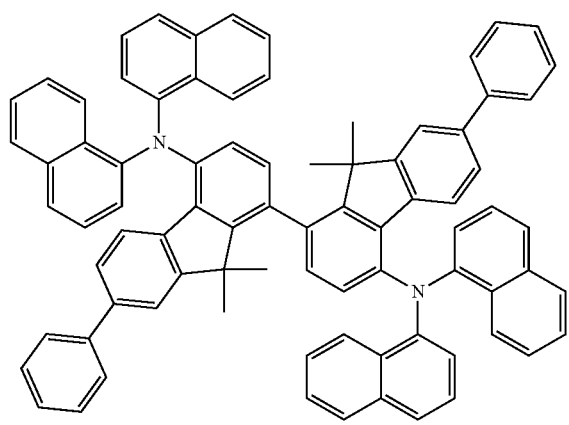
T-6
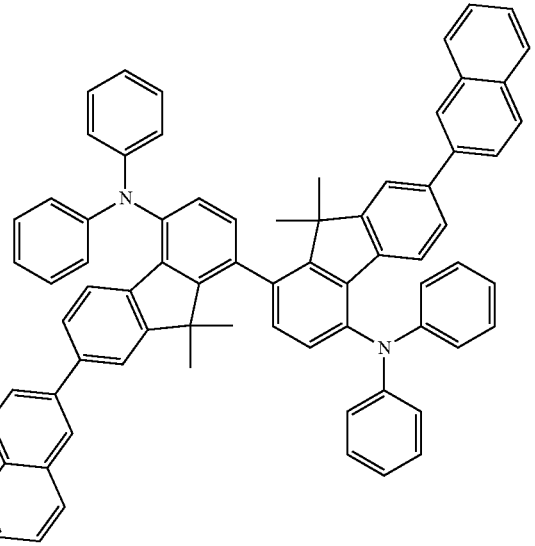
T-7
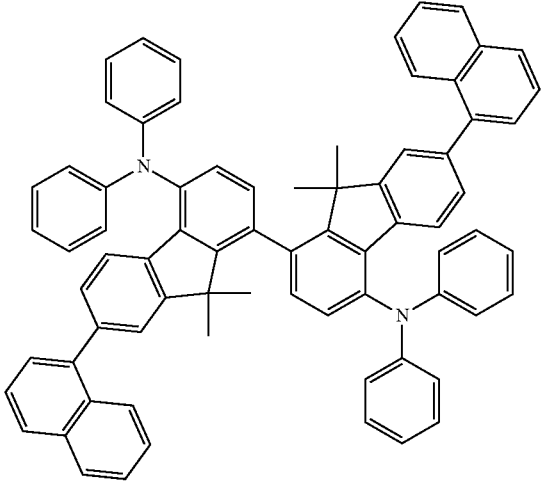
T-8
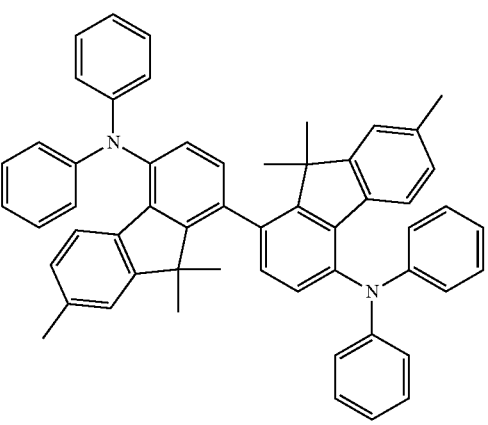

-continued

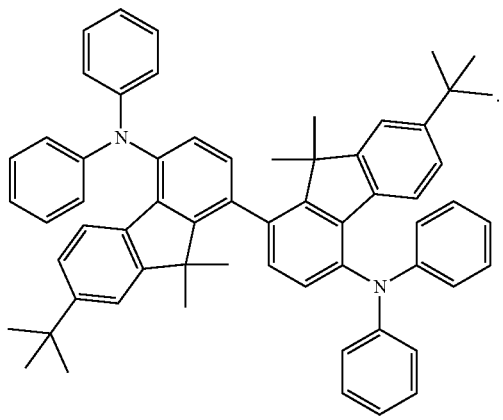

T-9

The organic light emitting device may further include a hole transport layer between the anode and the hole auxiliary layer.

The hole transport layer may include at least one of N-phenylcarbazole, polyvinylcarbazole, N,N'-bis(3-methylphenyl)-N,N'-diphenyl-[1,1-biphenyl]-4,4'-diamine (TPD), N,N'-di(1-naphthyl)-N,N'-diphenylbenzidine (NPB), 4,4',4"-tris(N-carbazolyl)triphenylamine (TCTA), and 4,4'-cyclohexylidene bis[N,N-bis(4-methylphenyl)benzenamine (TAPC).

The organic light emitting device may further include an electron transport layer between the electron auxiliary layer and the cathode.

The electron transport layer may include at least one of tris(8-quinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalene-1-yl)-3,5-diphenyl-4H-1,2,4-triazole (NTAZ), 2-(4-biphenylyl)-5-(4-tert-butylphenyl)-1,3,4-oxadiazole (t-Bu-PBD), bis(2-methyl-8-quinolinolato-N1,O8)-(1,1'-biphenyl-4-olato) aluminum (BAlq), berylliumbis(benzoquinolin-10-olate (Bebq2), and 9,10-di(naphthalene-2-yl)anthracene (ADN).

Embodiments are also directed to an organic light emitting display apparatus including a wiring part, a thin film transistor connected to the wiring part, and an organic light emitting device connected to the thin film transistor. The light emitting device may include an anode, an emission layer on the anode, an electron auxiliary layer on the emission layer, and a cathode on the electron auxiliary layer. The electron auxiliary layer may include a 9,10-diarylanthracene derivative and a bifluorene derivative.

An weight ratio of the 9,10-diarylanthracene derivative to the bifluorene derivative may be from about 7:3 to about 3:7.

The organic light emitting display apparatus may further include a hole auxiliary layer between the anode and the emission layer. The hole auxiliary layer may include an arylamine represented by the following Formula 1:

[Formula 1]

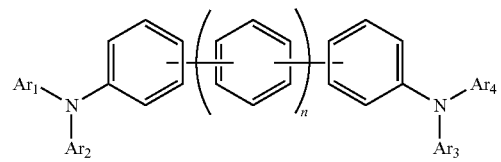

where $Ar_1$ to $Ar_4$ are independently a substituted or unsubstituted aryl group having 6 to 30 carbon atoms, a substituted or unsubstituted heteroaryl group having 2 to 30 carbon atoms, or a substituted or unsubstituted polycycloaryl group having 2 to 30 carbon atoms, and n is an integer from 2 to 4.

The arylamine may be at least one compound represented by H-1 to H-15 in the following Formula 2:

H-01

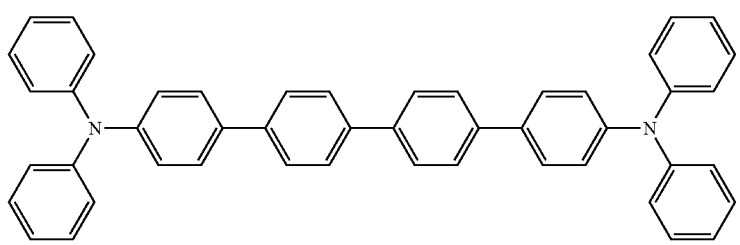

H-02

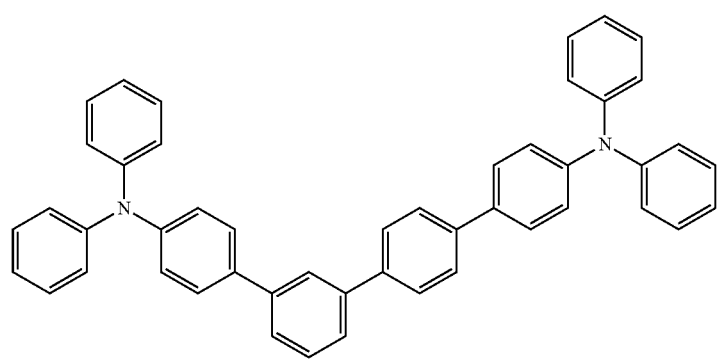

-continued
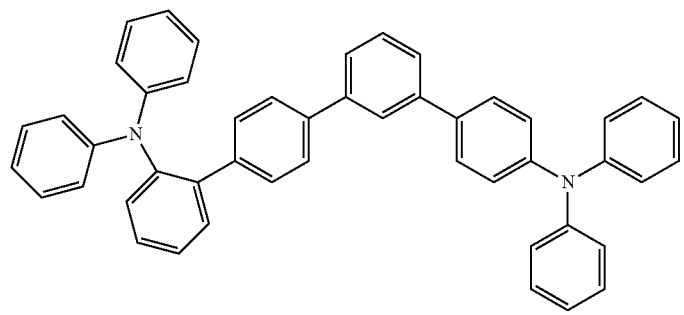
H-03
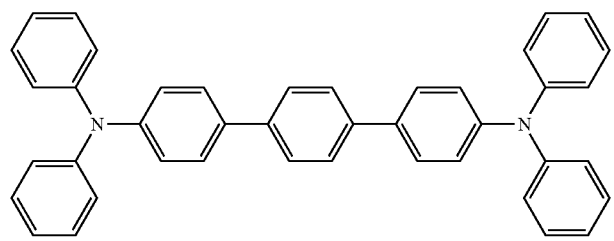
H-04
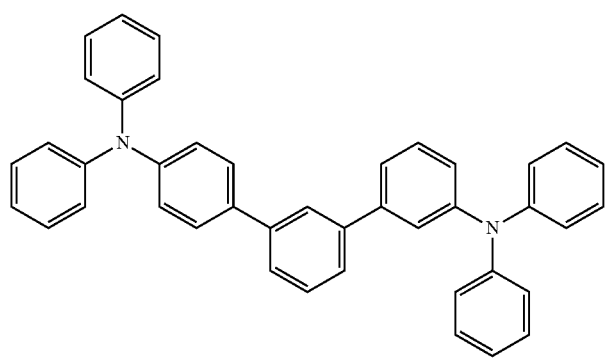
H-05
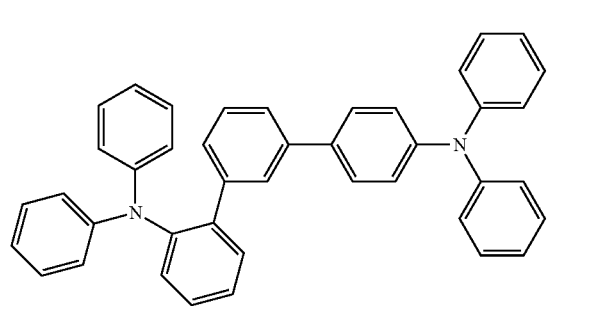
H-06
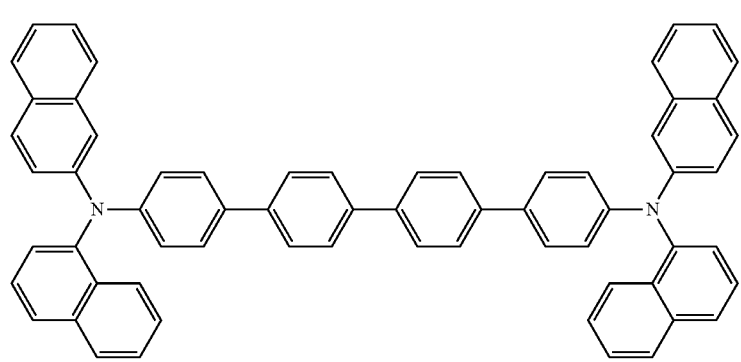
H-07

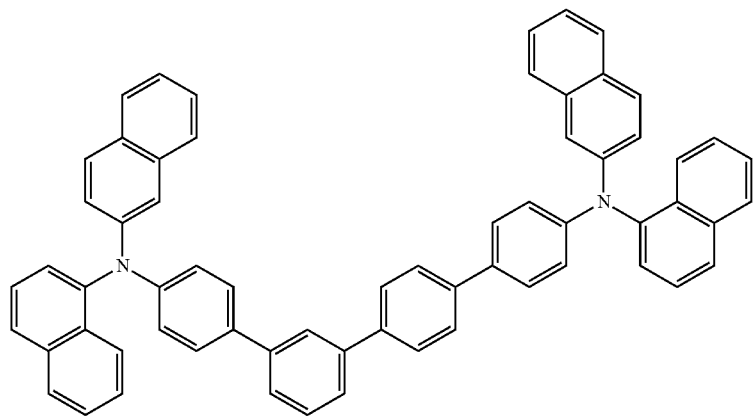
H-08
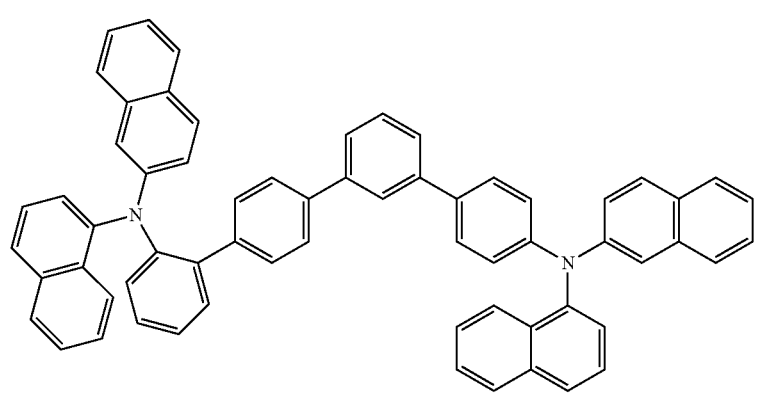
H-09
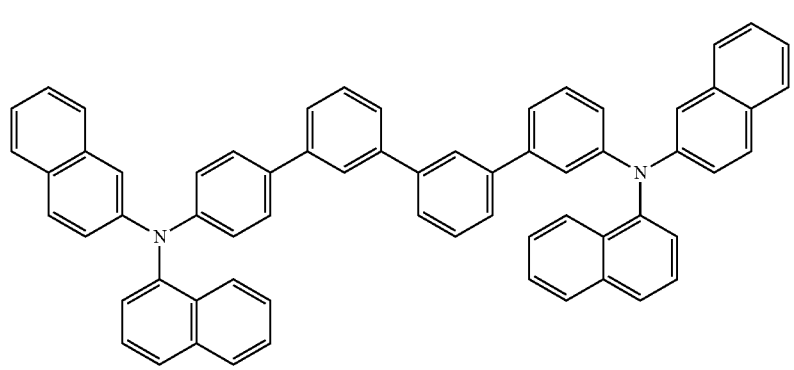
H-10
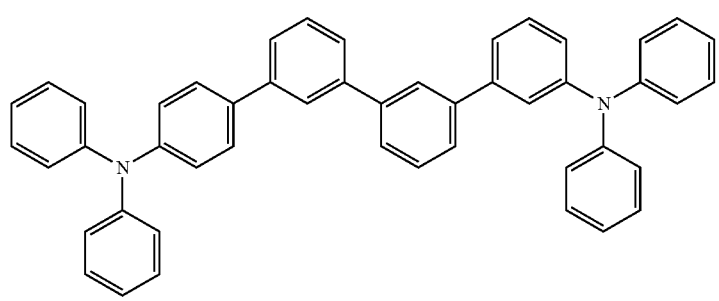
H-11

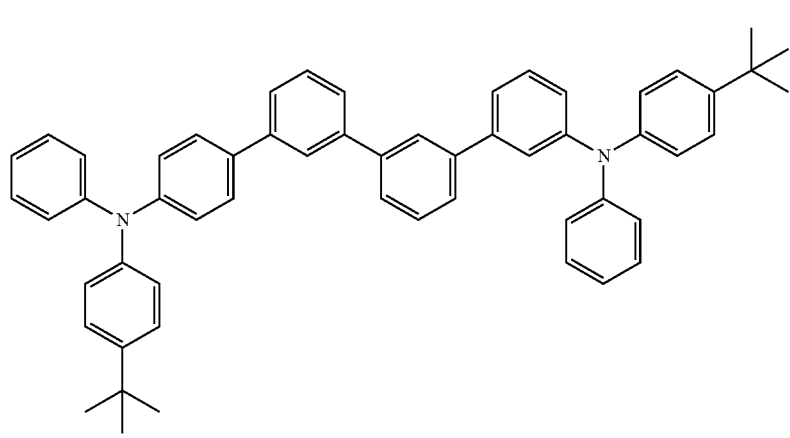
H-12
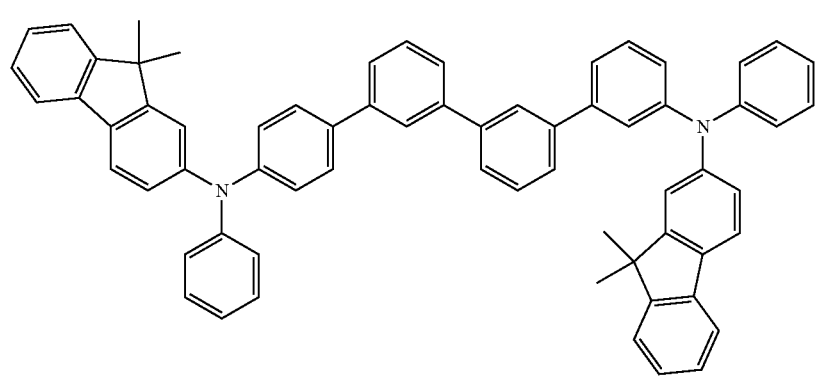
H-13
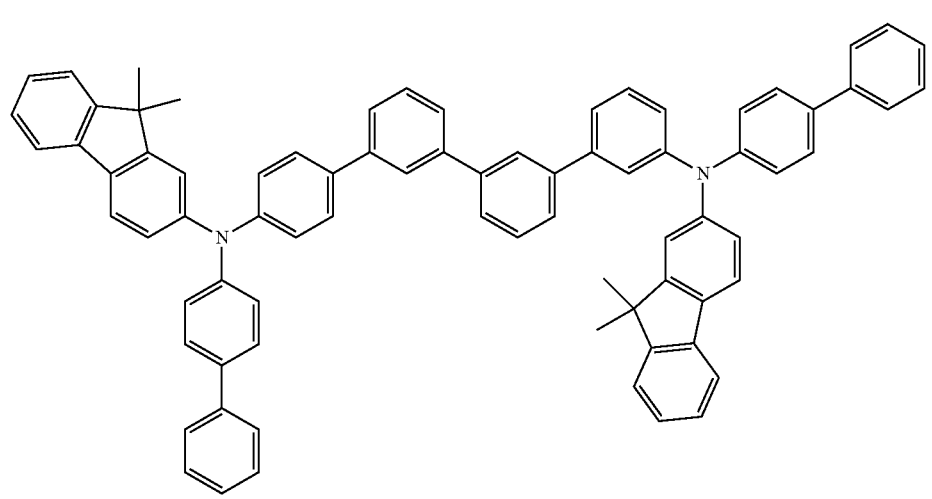
H-14

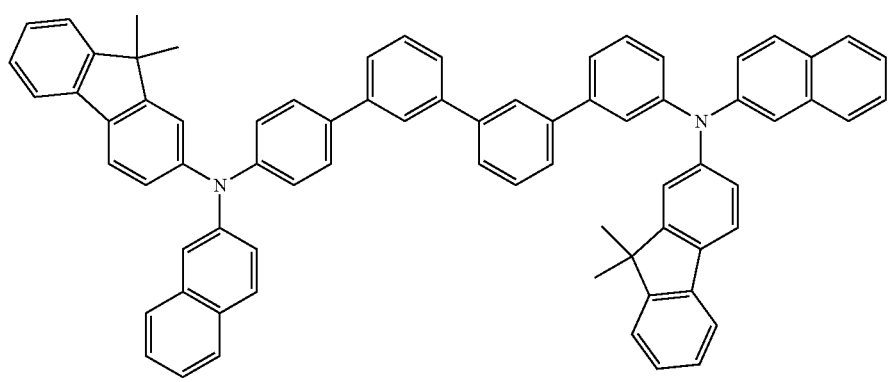

H-15

The 9,10-diarylanthracene derivative may be represented by the following Formula 3:

[Formula 3]

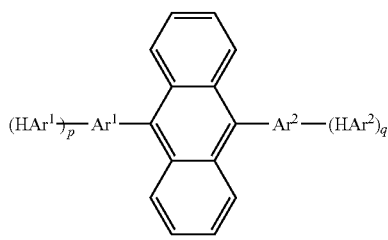

where Ar$^1$ is a substituted or unsubstituted phenylene group,

Ar$^2$ is a substituted or unsubstituted phenylene group or naphthalene group,

HAr$^1$ and HAr$^2$ are a substituted or unsubstituted pyridinyl group, quinolinyl group, or isoquinolinyl group, p and q are independently an integer from 0 to 3, and in the case that p or q is at least 2, the group HAr$^1$ and the group HAr$^2$ are respectively the same or different.

The 9,10-diarylanthracene derivative may be at least one compound represented by E1 to E9 in the following Formula 4:

[Formula 4]

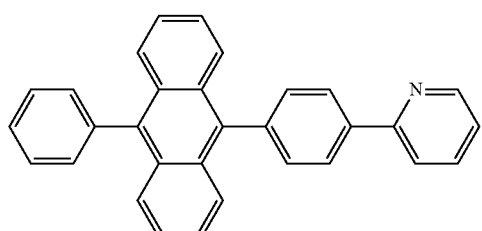

E1

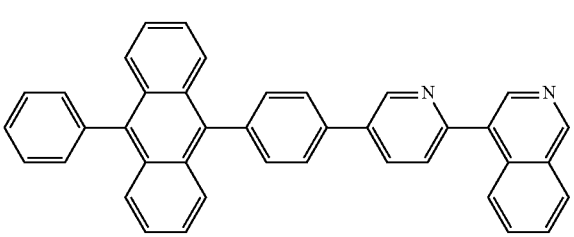

E2

E3

E4

E5

E6

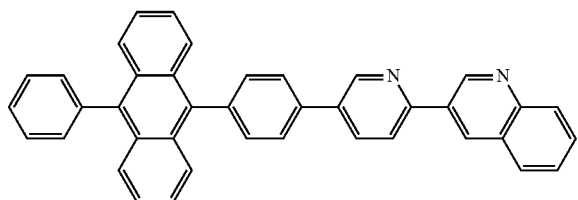

E7

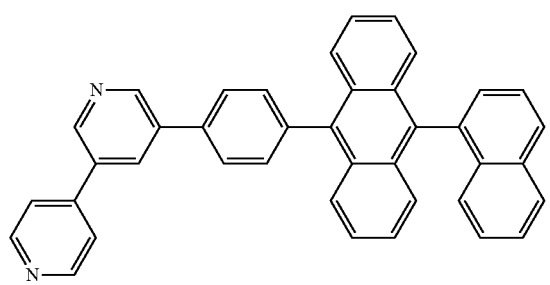

E8

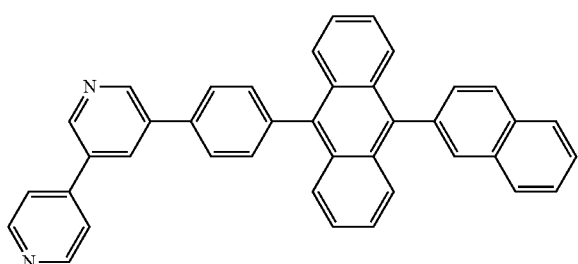

E9

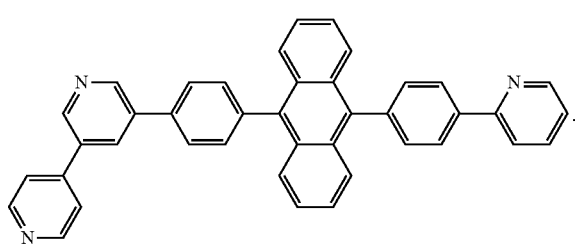

The bifluorene derivative may be represented by the following Formula 5:

[Formula 5]

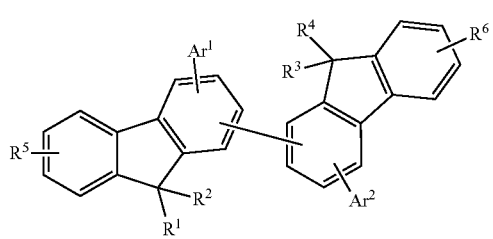

where $R^1$ to $R^6$ are independently hydrogen, deuterium, a halogen group, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted cycloalkyl group having 3 to 30 carbon atoms, a substituted or unsubstituted alkoxy group having 1 to 30 carbon atoms, a substituted or unsubstituted aryloxy group having 6 to 30 carbon atoms, a substituted or unsubstituted arylthiol group having 6 to 30 carbon atoms, a substituted or unsubstituted aryl group having 6 to 30 carbon atoms, a substituted or unsubstituted heteroaryl group having 2 to 30 carbon atoms, a substituted or unsubstituted amine group having 1 to 30 carbon atoms, a substituted or unsubstituted silyl group, a cyano group, a nitro group, a hydroxyl group, a carboxyl group, or a combination thereof, and $Ar^1$ and $Ar^2$ are independently hydrogen, deuterium, a halogen group, a substituted or unsubstituted alkyl group having 1 to 30 carbon atoms, a substituted or unsubstituted aryl group having 6 to 30 carbon atoms, a substituted or unsubstituted heteroaryl group having 2 to 30 carbon atoms, a substituted or unsubstituted amine group having 1 to 30 carbon atoms, or a combination thereof.

The bifluorene derivative may be at least one compound represented by T-1 to T-9 in the following Formula 6:

[Formula 6]

T-1

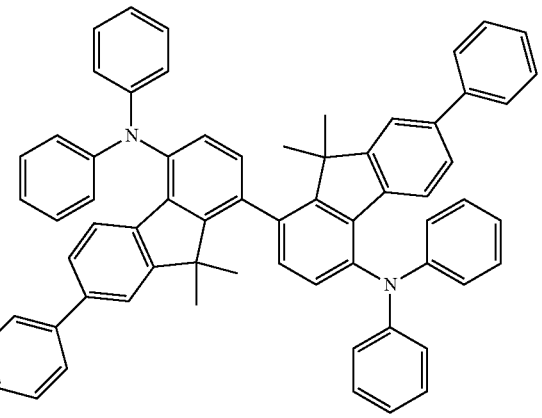

T-2

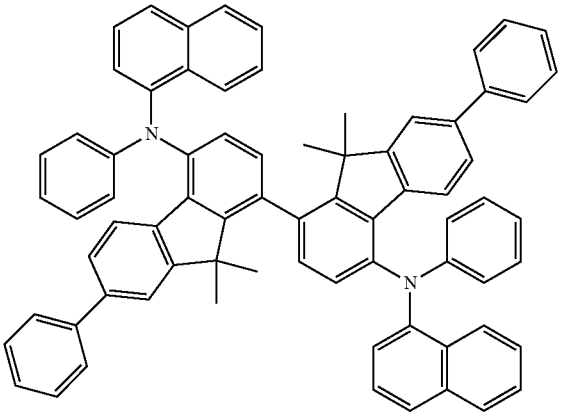

T-3
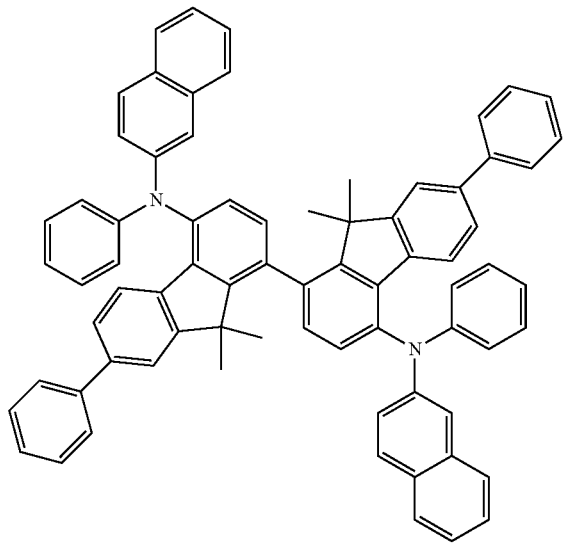
T-4
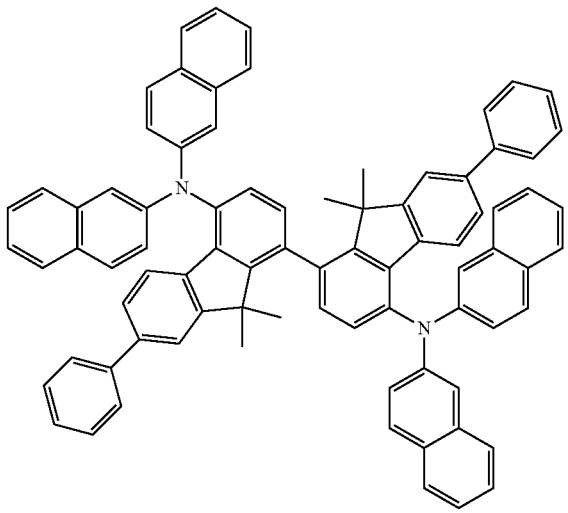
T-5
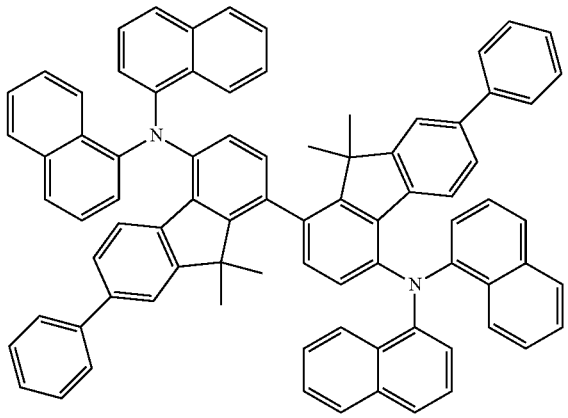
T-6
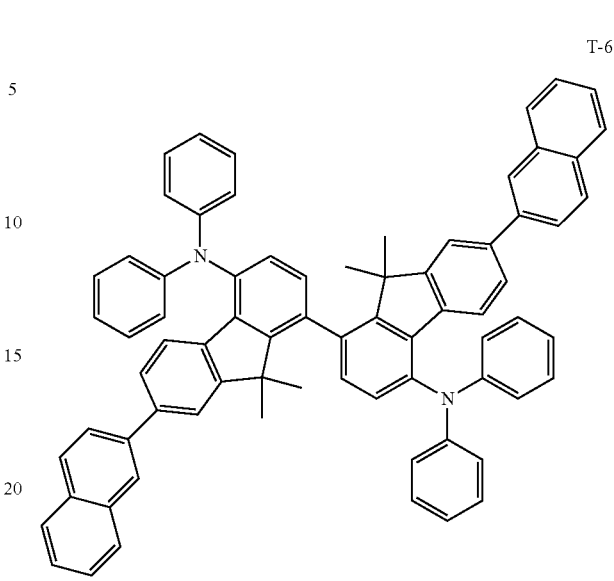
T-7
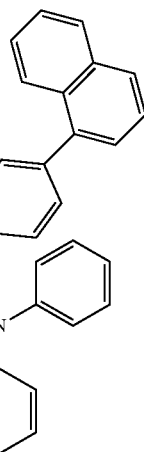
T-8
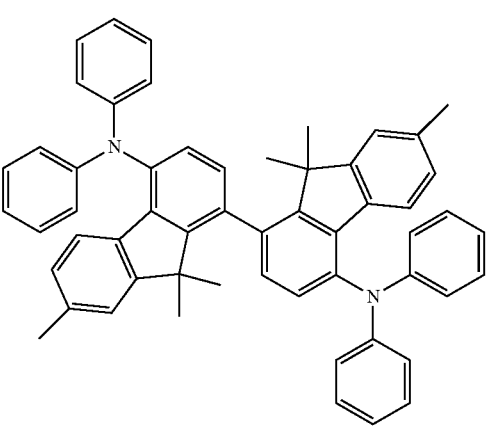

T-9

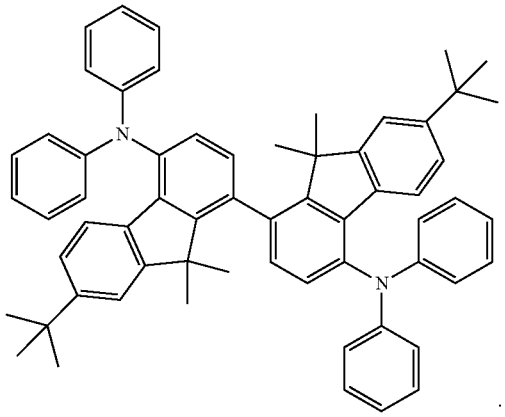

The organic light emitting device having the above-described structure may be applied in a display apparatus. A display apparatus according to an embodiment may include a wiring part, a thin film transistor connected to the wiring part, and an organic light emitting device connected to the thin film transistor.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
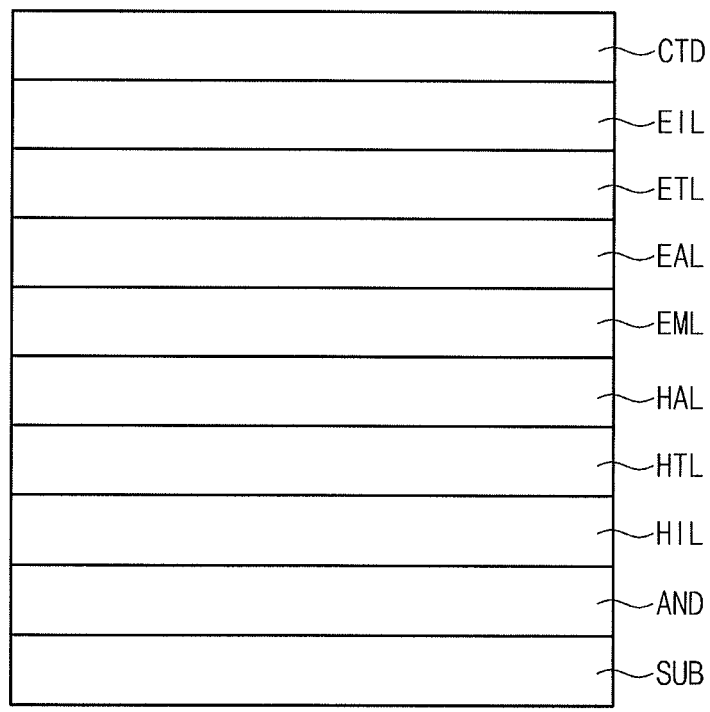
FIG. 1 illustrates a schematic cross-sectional view of an organic light emitting device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, these elements should not be limited by these terms. These terms are only used to distinguish one element from another element. Thus, a first element discussed below could be termed a second element, and a second element could be termed as a first element. As used herein, the singular forms are intended to include the plural forms as well, unless the context clearly indicates otherwise.

FIG. 1 is a schematic cross-sectional view of an organic light emitting device according to an embodiment.

Referring to FIG. 1, an organic light emitting device according to an embodiment may include an anode AND, a hole injection layer HIL, a hole transport layer HTL, a hole auxiliary layer HAL, an emission layer EML, an electron auxiliary layer EAL, an electron transport layer ETL, an electron injection layer EIL, and a cathode CTD, subsequently stacked on a substrate SUB.

The substrate SUB may be an insulating substrate manufactured by using glass, crystal, an organic polymer, etc. As the organic polymer forming the substrate SUB, polyethylene terephthalate (PET), polyethylene naphthalate (PEN), polyimide, polyethersulfone, etc. may be used. The material for the substrate SUB may be selected in consideration of mechanical strength, thermal stability, transparency, surface smoothness, availability of handling, water resistance, etc.

The anode AND is provided on the substrate SUB and has conductivity.

The anode AND may be formed by using a transparent metal oxide, for example, indium tin oxide (ITO), indium zinc oxide (IZO), zinc oxide (ZnO), indium tin zinc oxide (ITZO), etc. and may be formed by a suitable deposition method, before forming a hole injection part.

The hole injection layer HIL may include, for example, a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate (PANI/PSS), etc.

The hole injection layer HIL may be formed using a suitable method such as a vacuum deposition method, a spin coating method, a cast method, an LB method, etc. In the case that the hole injection layer HIL is formed by the vacuum deposition method or the spin coating method, forming conditions may be dependent on the compounds used, the properties of the target hole injection layer HIL.

The thickness of the hole injection layer HIL may be from about 100 Å to about 10,000 Å, for example, from about 100 Å to about 1,000 Å.

The hole transport layer HTL may include, for example, a carbazole derivative such as N-phenylcarbazole, polyvinylcarbazole, etc., a triphenylamine-based derivative such as N,N'-bis(3-methylphenyl)-N,N'-diphenyl-[1,1-biphenyl]-4,4'-diamine (TPD), etc., N,N'-di(1-naphthyl)-N,N'-diphenylbenzidine (NPB), 4,4',4"-tris(N-carbazolyl)triphenylamine (TCTA), 4,4'-cyclohexylidene bis[N,N-bis(4-methylphenyl) benzenamine (TAPC), etc.

The thickness of the hole transport layer HTL may be from about 50 Å to about 1,000 Å, for example, from about 100 Å to about 800 Å. The hole transport layer HTL may be formed by a method such as a vacuum deposition method, a spin coating method, a cast method, an LB method, etc.

In the case that the hole transport layer HTL is formed by the vacuum deposition method, the deposition conditions may be dependent on the compound used as the material of the hole transport layer HTL, and the properties of the target hole transport layer HTL. As examples, appropriate conditions may be selected from a deposition temperature of from about 100° C. to about 500° C., a vacuum degree of from about $10^{-8}$ torr to about $10^{-3}$ torr, and a deposition rate of from about 0.01 Å/sec to about 100 Å/sec.

In the case that the hole transport layer HTL is formed by the spin coating method, the coating conditions may be dependent on the compound used as the material of the hole transport layer HTL, and the properties of the target hole transport layer HTL. As examples, appropriate conditions may be selected from a coating rate of from about 2,000 rpm to about 5,000 rpm, and a heat treatment temperature for removing solvents after coating of from about 80° C. to about 200° C.

The hole transport layer HTL and the hole injection layer HIL may be formed as separate layers. In other implementations, a single layer (referred to as a hole functional layer) having both functions of the hole injection and the hole transport may be formed. In this case, the hole functional layer may include at least one material of the above materials for the hole injection layer and at least one of the above materials for the hole transport layer. In this case, the thickness of the hole functional layer may be from about 500 Å to about 10,000 Å, for example, from about 100 Å to about 1,000 Å.

The hole injection layer HIL, the hole transport layer HTL, or the hole functional layer may further include a charge-producing material other than the hole injection material and the hole transport material to improve the conductivity of the layer. The charge-producing material may be, for example, a p-dopant. Examples of the p-dopant include a quinone derivative such as tetracyanoquinodimethane (TCNQ) or 2,3,5,6-tetrafluoro-tetracyano-1,4-benzoquinonedimethane (F4TCNQ), a metal oxide such as tungsten oxide or molybdenum oxide, and a cyano group-containing compound.

In the case that the hole injection layer HIL, the hole transport layer HTL, or the hole functional layer further includes the charge-producing material, the charge-producing material may be homogeneously dispersed or non-homogeneously dispersed, or dispersed with a concentration gradient in the layers.

The hole auxiliary layer may be provided between the hole transport layer and the emission layer to block the injection of electrons and excitons from the emission layer into the hole transport layer. A material forming the hole auxiliary layer may be selected from materials having a sufficiently high energy barrier (for example, a substantially lower LUMO energy level than the LUMO energy level of the emission layer) such that the probability of the injection of high energy electrons into the hole transport layer may be very small. The hole auxiliary layer may also prevent the diffusion of the excitons from the emission layer.

The hole auxiliary layer may include an arylamine represented by the following Formula 1.

[Formula 1]

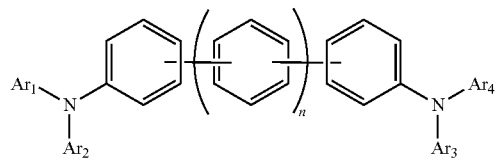

where $Ar_1$ to $Ar_4$ are independently a substituted or unsubstituted aryl group having 6 to 30 carbon atoms, a substituted or unsubstituted heteroaryl group having 2 to 30 carbon atoms, or a substituted or unsubstituted polycycloaryl group having 2 to 30 carbon atoms, and n is an integer from 2 to 4.

The arylamine may be at least one of compounds represented by H-01 to H-15 in the following Formula 2.

[Formula 2]

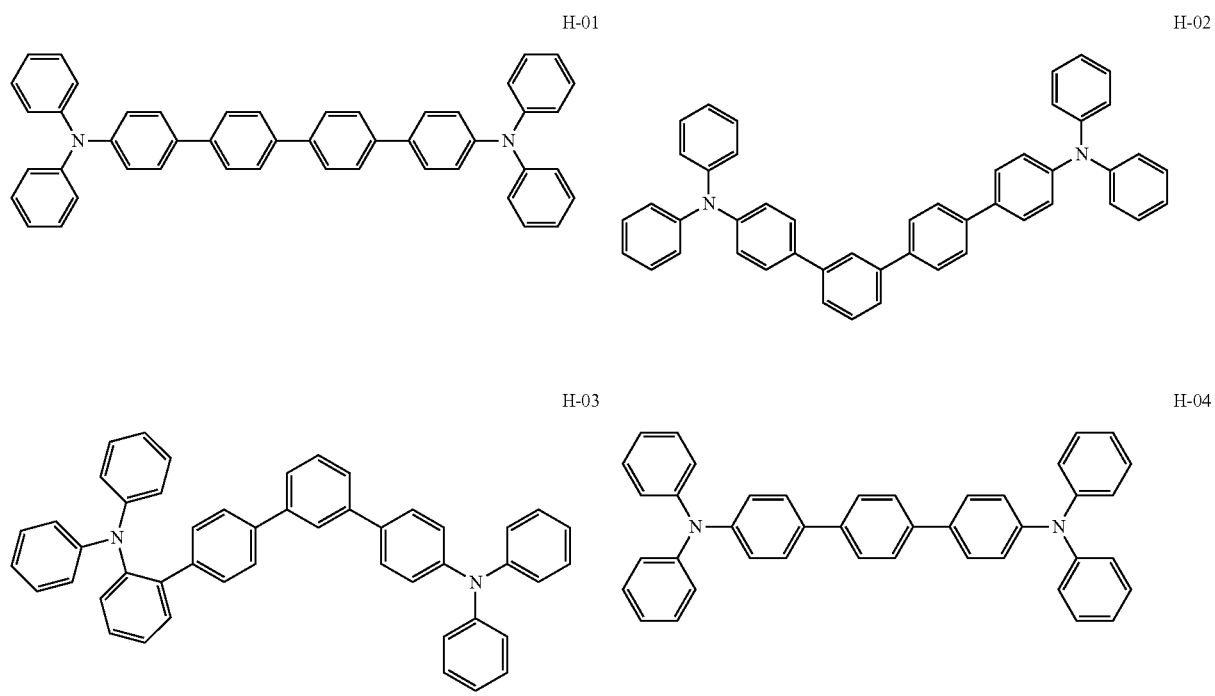

-continued
H-05
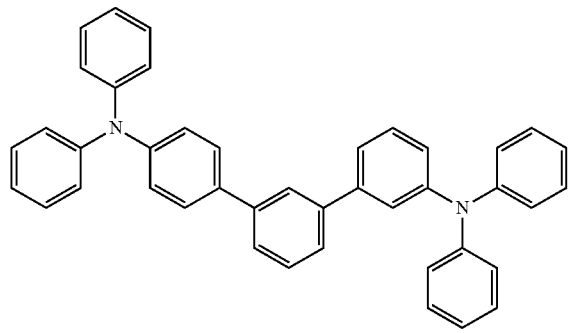
H-06
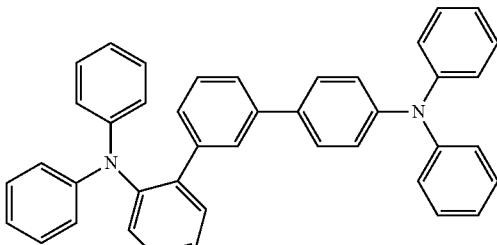
H-07
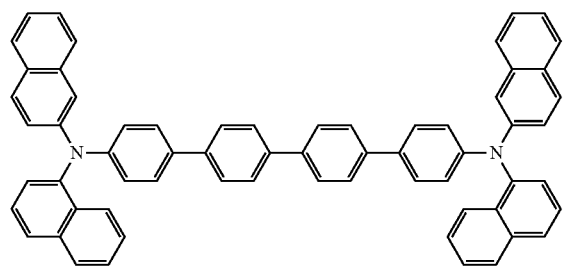
H-08
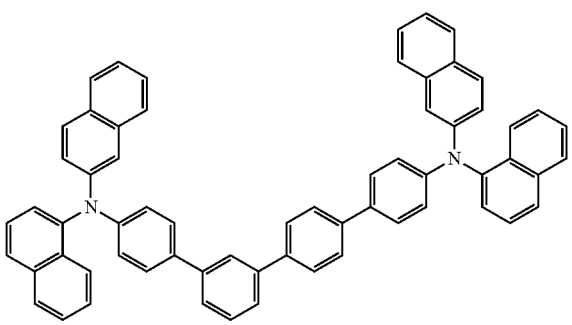
H-09
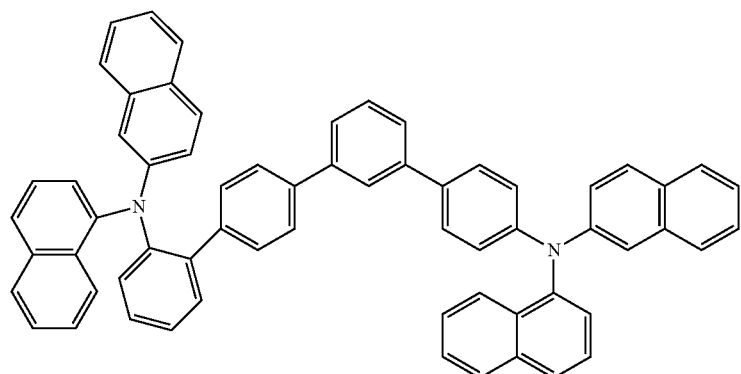
H-10
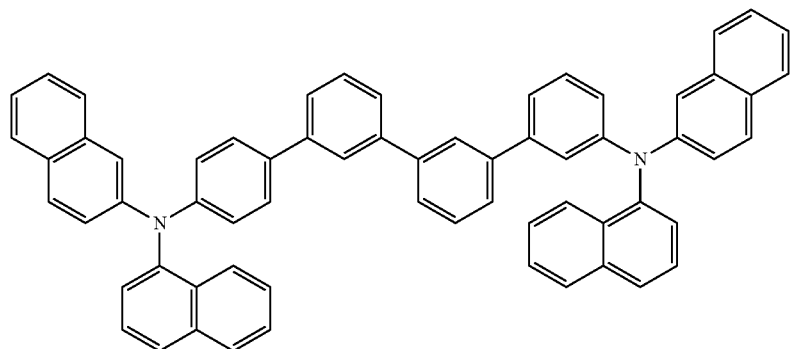

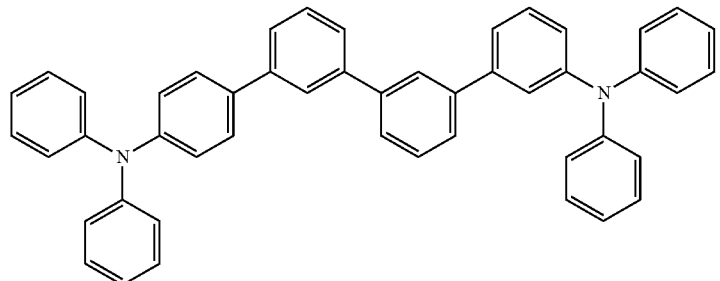
H-11
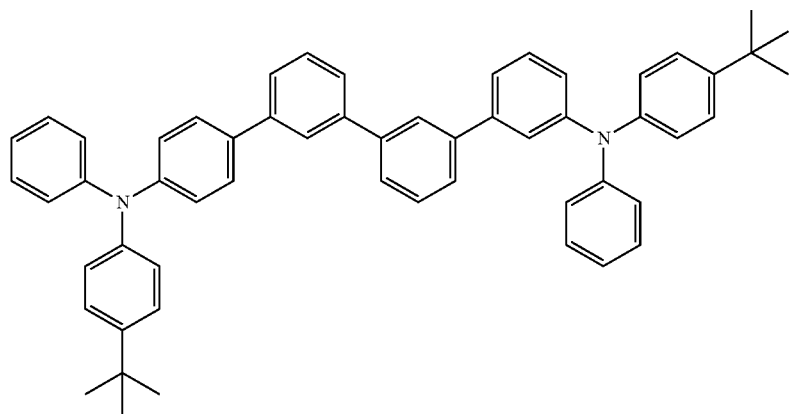
H-12
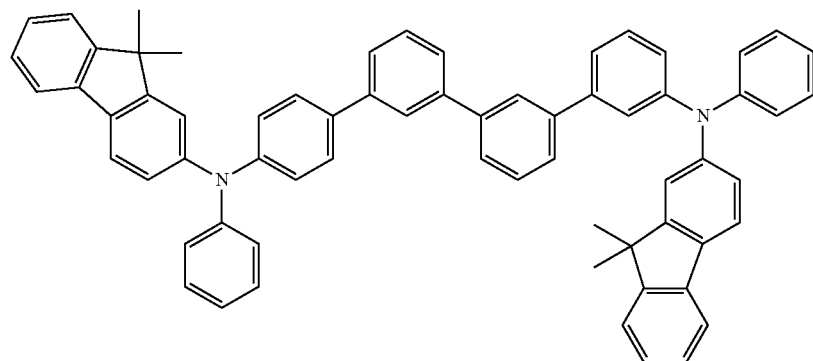
H-13
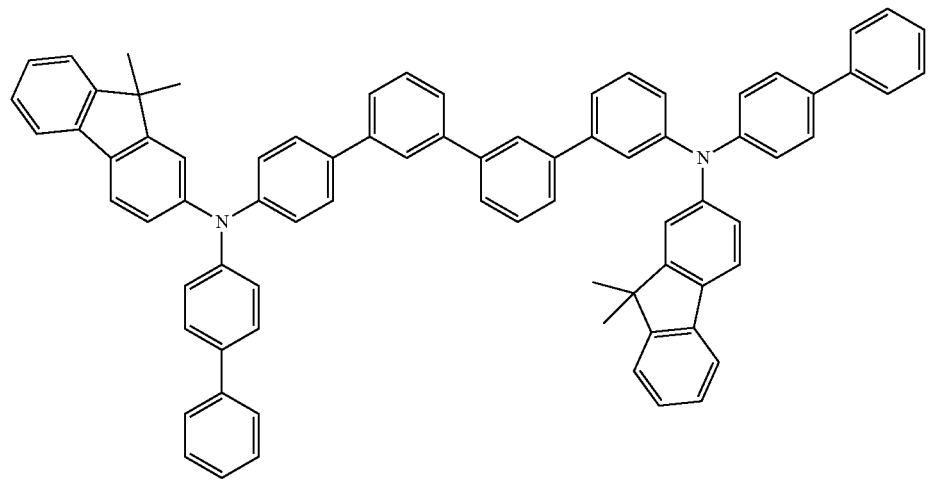
H-14

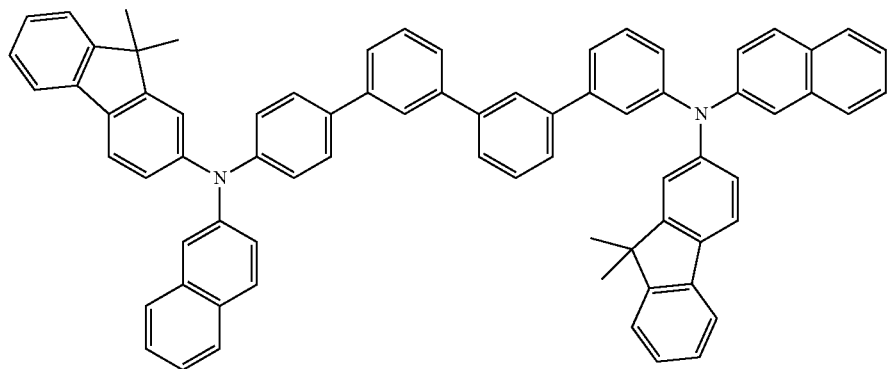

H-15

The emission layer EML may include at least emitting material. The emitting material may include both of host and dopant.

The host may include tris(8-hydroxyquinolinato)aluminum (Alq3), 4,4'-bis(N-carbazolyl)-1,1'-biphenyl (CBP), poly(n-vinylcarbazole (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), etc.

Various dopants such as a fluorescent dopant or a phosphorescent dopant may be used as the dopant. The phosphorescent dopant may be an organo metal complex including Ir, Pt, Os, Re, Ti, Zr, Hf or a combination of at least two thereof. A red dopant may include Pt(II) octaethylporphine (PtOEP), tris(2-phenylisoquinoline)iridium (Ir(piq)$_3$, bis(2-(2'-benzothienyl)-pyridinato-N,C3')iridium(acetylacetonate) (Btp$_2$Ir(acac)), etc. A green dopant may include tris(2-phenylpyridine)iridium (Ir(ppy)$_3$), bis(2-phenylpyridine (acetylacetonato)iridium(III) (Ir(ppy)$_2$(acac)), tris(2-(4-tolyl)phenylpyridine)iridium (Ir(mppy)$_3$, 10-(2-benzothiazolyl)-1,1,7,7-tetramethyl-2,3,6,7-tetrahydro-1H, 5H,11H-[1]benzopyrano[6,7,8-ij]-quinolizin-11-one (C545T), etc. A blue dopant may include bis[3,5-difluoro-2-(2-pyridyl)phenyl](picolinato)iridium(III) (F2Irpic), (F2ppy)2Ir(tmd), Ir(dfppz)3,4,4'-bis(2,2'-diphenylethen-1-yl)biphenyl (DPVBi), 4,4'-bis[4-(diphenylamino)styryl]biphenyl (DPAVBi), 2,5,8,11-tetra-tert-butylperylene (TBPe), etc.

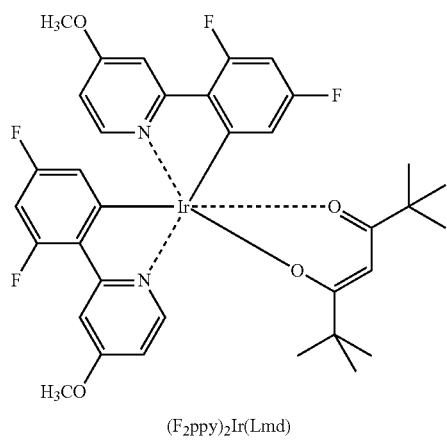

(F2ppy)2Ir(Lmd)

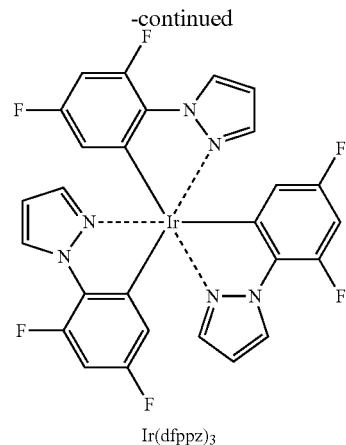

Ir(dfppz)3

When the emission layer EML includes the host and the dopant, the amount of the dopant may be selected in the range from about 0.01 to about 15 parts by weight with respect to 100 parts by weight of the host.

The thickness of the emission layer EML may be from about 100 Å to about 1,000 Å, for example, from about 200 Å to about 600 Å. The thickness of the emission layer EML may be determined according to the kind of materials or the structure of the device.

The emission layer EML may be formed using a method such as a vacuum deposition method, a spin coating method, a cast method, a Langmuir-Blodgett (LB) method, etc.

The electron auxiliary layer may be provided between the emission layer and the electron transport layer to block the injection of holes and excitons from the emission layer into the electron transport layer. A material forming the electron auxiliary layer may be selected from materials having sufficiently high energy barrier (for example, having a substantially higher HOMO energy level than the HOMO energy level of the emission layer) such that the probability of the injection of high energy holes into the electron transport layer may be very small. The electron auxiliary layer may also prevent the diffusion of the excitons from the emission layer.

The electron auxiliary layer may include a 9,10-diarylanthracene derivative and a bifluorene derivative. The weight ratio of the 9,10-diarylanthracene derivative to the bifluorene derivative may be from about 7:3 to about 3:7. If the weight ratio of the 9,10-diarylanthracene derivative to the bifluorene derivative deviates from the above range, the functioning of the electron auxiliary layer as the hole blocking layer may be difficult, and the luminous efficiency and the life of a device may be decreased.

The 9,10-diarylanthracene derivative is represented by the following Formula 3.

[Formula 3]

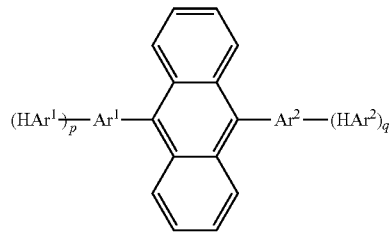

where Ar$^1$ is a substituted or unsubstituted phenylene group,

Ar$^2$ is a substituted or unsubstituted phenylene group or naphthalene group,

HAr$^1$ and HAr$^2$ are a substituted or unsubstituted pyridinyl group, quinolinyl group, or isoquinolinyl group, p and q are independently an integer from 0 to 3, and in the case that p or q is at least 2, the respective groups HAr$^1$ or t HAr$^2$ are the same or different.

In an embodiment, the 9,10-diarylanthracene derivative may be at least one of the compounds represented by E1 to E9 in the following Formula 4.

[Formula 4]

E1
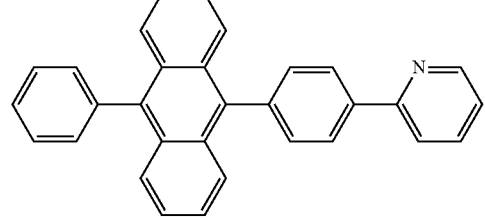

E2
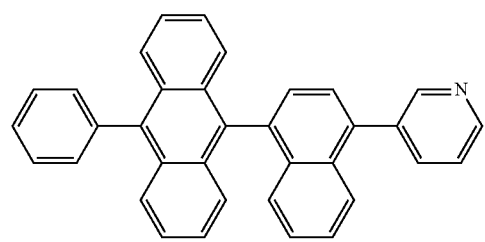

E3
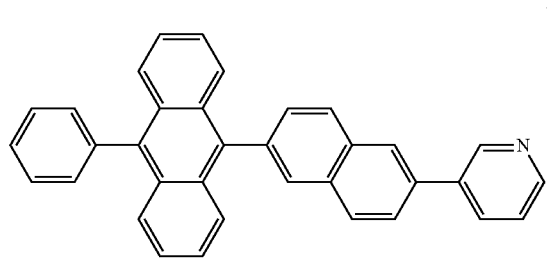

-continued

E4
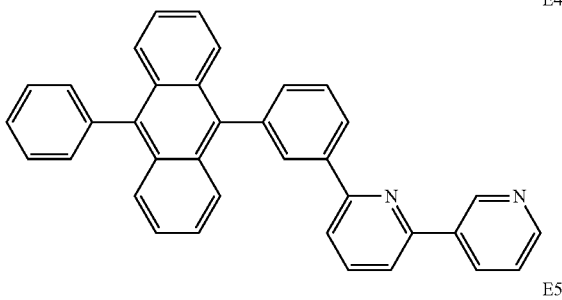

E5
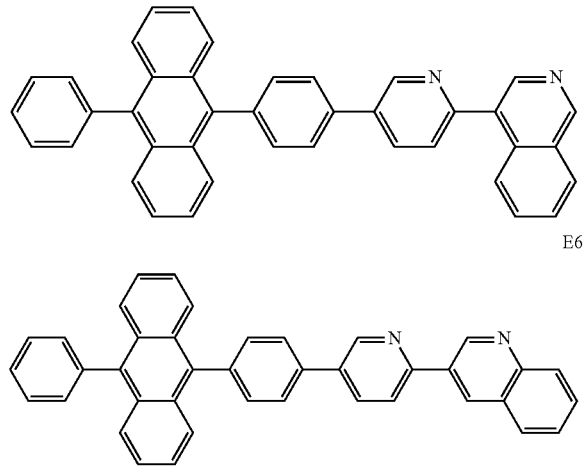

E6
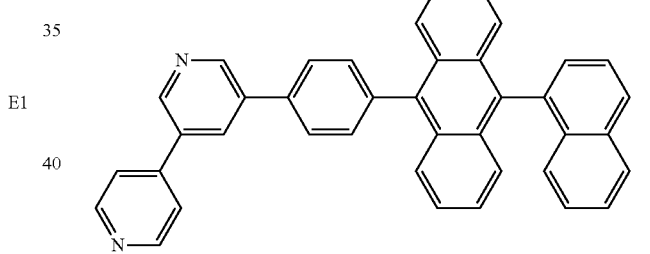

E7
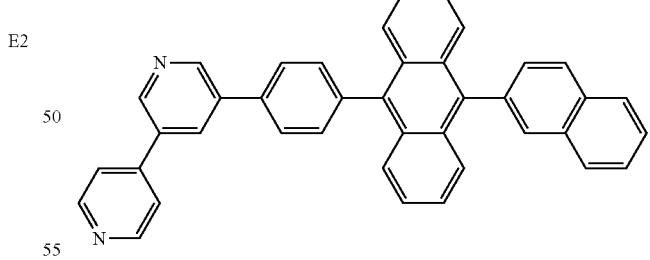

E8
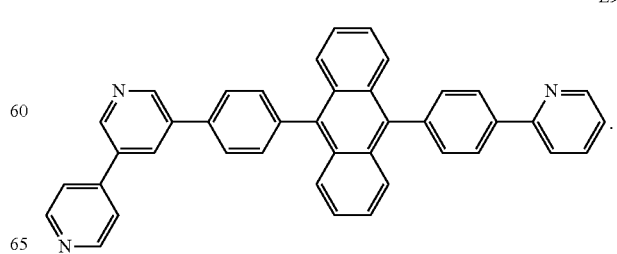

E9

The bifluorene derivative may be represented by the following Formula 5.

[Formula 5]

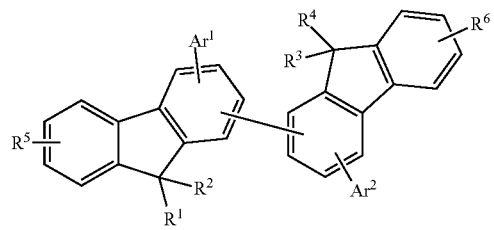

where $R^1$ to $R^6$ are independently hydrogen, deuterium, a halogen group, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted cycloalkyl group having 3 to 30 carbon atoms, a substituted or unsubstituted alkoxy group having 1 to 30 carbon atoms, a substituted or unsubstituted aryloxy group having 6 to 30 carbon atoms, a substituted or unsubstituted arylthiol group having 6 to 30 carbon atoms, a substituted or unsubstituted aryl group having 6 to 30 carbon atoms, a substituted or unsubstituted heteroaryl group having 2 to 30 carbon atoms, a substituted or unsubstituted amine group having 1 to 30 carbon atoms, a substituted or unsubstituted silyl group, a cyano group, a nitro group, a hydroxyl group, a carboxyl group, or a combination thereof, and $Ar^1$ and $Ar^2$ are independently hydrogen, deuterium, a halogen group, a substituted or unsubstituted alkyl group having 1 to 30 carbon atoms, a substituted or unsubstituted aryl group having 6 to 30 carbon atoms, a substituted or unsubstituted heteroaryl group having 2 to 30 carbon atoms, a substituted or unsubstituted amine group having 1 to 30 carbon atoms, or a combination thereof.

In an embodiment, the bifluorene derivative may be at least one of the compounds represented by T-1 to T-9 in the following Formula 6.

T-1

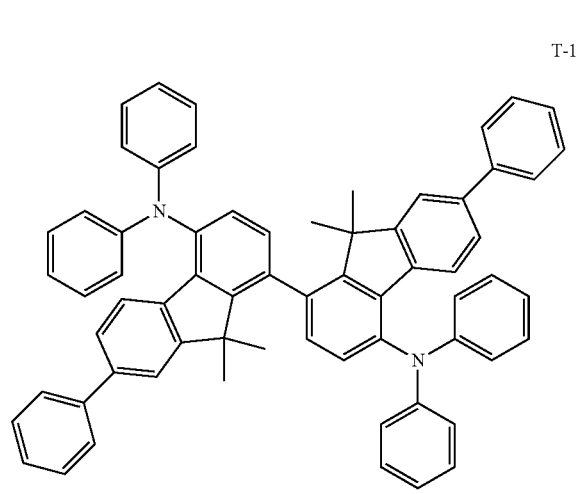

T-2

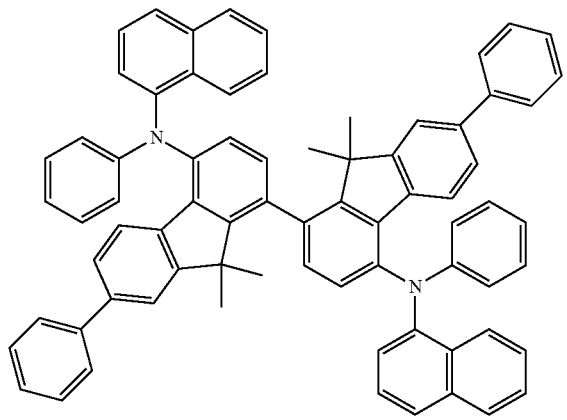

T-3

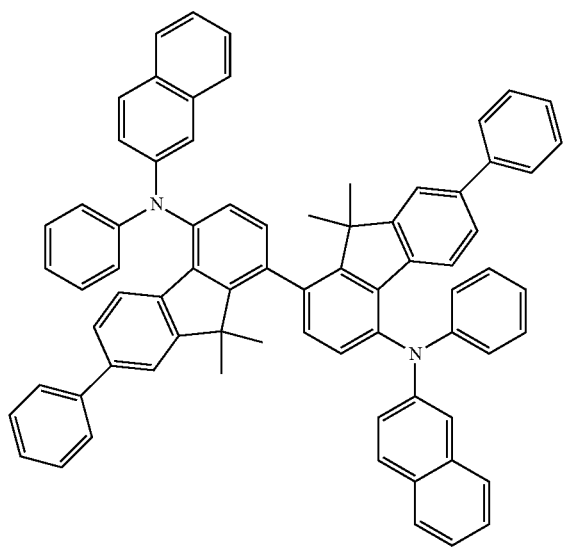

T-4

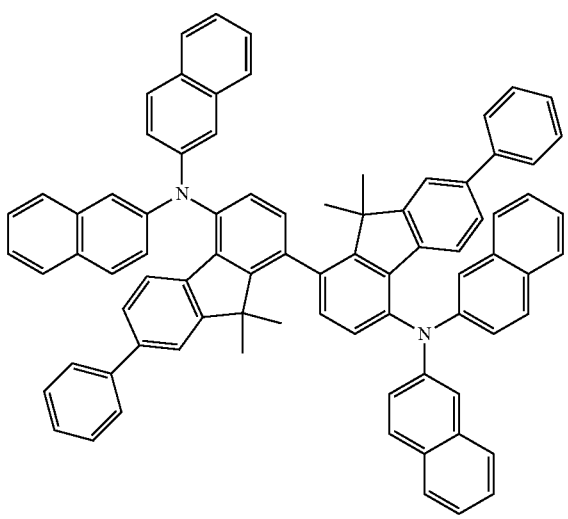

T-5

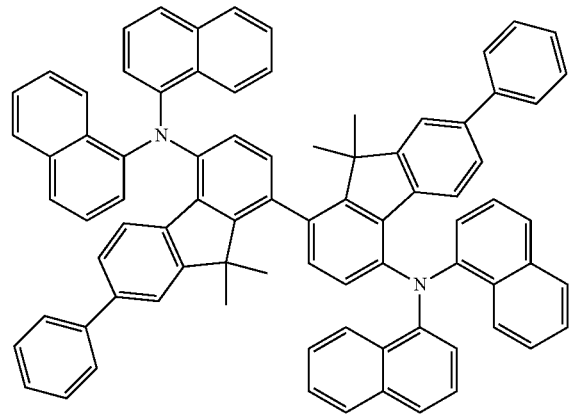

T-6

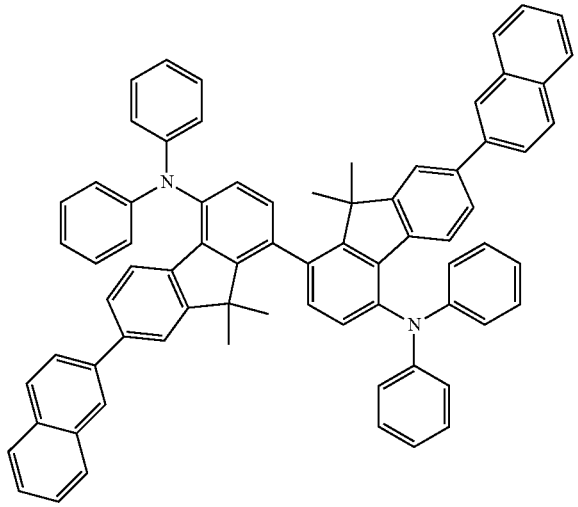

T-7

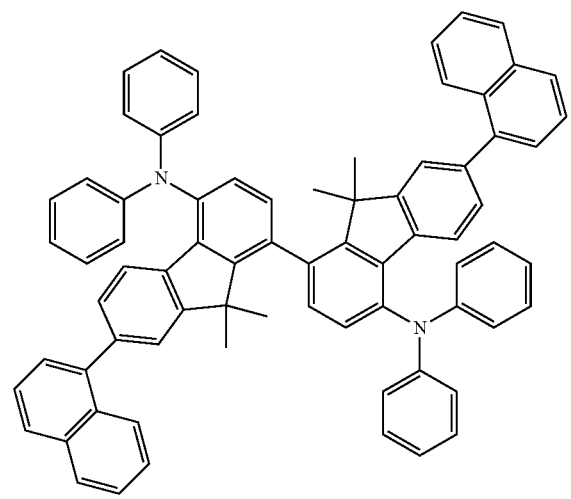

T-8

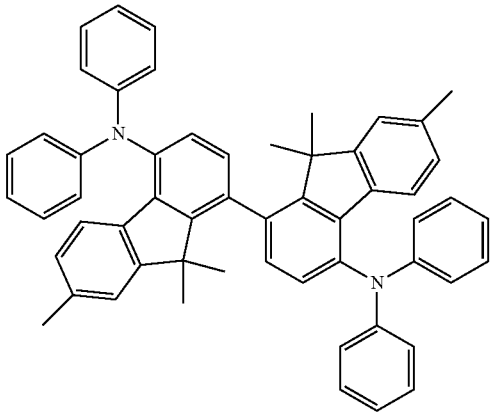

T-9

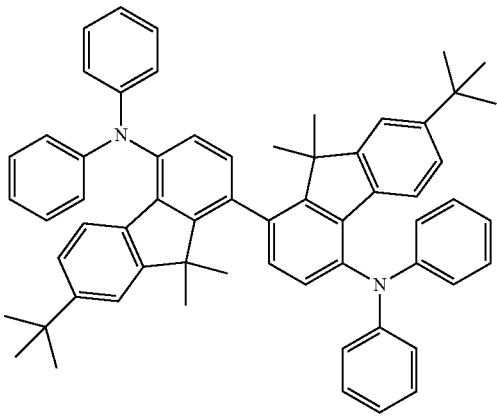

The electron transport layer ETL may include a material such as tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di(naphthalene-2-yl)anthracene (ADN), etc.

The thickness of the electron transport layer ETL may be from about 200 Å to about 400 Å, or from about 250 Å to about 350 Å.

The electron transport layer ETL may be formed by a vacuum deposition method, a spin coating method, a cast method, or an LB method. In the case that the electron transport layer ETL is formed by the vacuum deposition method or the spin coating method, deposition conditions and coating conditions may depend on the compounds used. The electron transport layer ETL may be formed by substantially the same method as that for forming the hole transport layer HTL.

The electron injection layer EIL may be provided on the surface of the electron transport layer ETL. The electron injection layer EIL may be formed using a metal-containing material. The metal-containing material may be LiF, lithium quinolate (LiQ), $Li_2O$, BaO, NaCl, CsF, etc. The electron injection layer EIL may be formed on the surface of the electron transport layer ETL by, for example, vacuum thermal depositing or spin coating an electron injection material. The electron injection layer EIL may be also formed by using a mixed material of an electron transport material and an insulating organo metal salt. The organo metal salt may be a material having an energy band gap of at least about 4 eV. For example, the organo metal salt may include, a metal acetate, a metal benzoate, a metal acetoacetate, a metal acetylacetonate, or a metal stearate.

The electron transport layer and the electron injection layer may be provided as separate layers. In other implementations, the electron transport layer and the electron injection layer may be manufactured as a single layer (referred to as an electron functional layer) serving both functions of electron transport and electron injection. The electron functional layer may include at least one of the above materials of the electron injection layer and at least on of the above materials of the electron transport layer.

The cathode CTD may be formed by using a metal or an alloy having low work function, an electrically conductive compound, or a mixture thereof. For example, the cathode CTD may include lithium (Li), magnesium (Mg), aluminum (Al), aluminum-lithium (Al—Li), calcium (Ca), magnesium-indium (Mg—In), magnesium-silver (Mg—Ag), etc.

In the operation of an organic light emitting device having the above-described structure, voltages may be applied to the anode AND and the cathode CTD, respectivelyHoles injected from the anode AND may move to the emission layer EML, and electrons injected from the cathode CTD may move to the emission layer EML. The electrons and the holes are recombined in the emission layer EML to produce excitons. Light may be emitted through the dropping of the excitons from an excited state to a ground state.

In the organic light emitting device having the above-described structure, the injection of electrons or holes in the emission layer into an adjacent hole transport layer or an adjacent electron transport layer may be hindered or prevented, and light emission in the emission layer may be efficiently performed. In addition, the deterioration of a device due to the generation of the light emission in other than the emission layer may be prevented or hindered, and the life of the device may be increased.

Hereinafter, the effect of the organic light emitting device according to an embodiment will be explained referring to Examples and Comparative Examples. The Examples and Comparative Examples are provided in order to highlight characteristics of one or more embodiments, but it is to be understood that the Examples and Comparative Examples are not to be construed as limiting the scope of the embodiments, nor are the Comparative Examples to be construed as being outside the scope of the embodiments. Further, it is to be understood that the embodiments are not limited to the particular details described in the Examples and Comparative Examples.

In the following Table 1, emission efficiency and life of organic light emitting devices and organic light emitting devices according to exemplary embodiments are illustrated. In the following Table 1, T95 indicates the elapsed time to exhibit 95% of luminance with respect to 100% of luminance exhibited in an initial emission.

TABLE 1

| | | Electron auxiliary layer | | | | |
|---|---|---|---|---|---|---|
| | Hole auxiliary layer | 9,10-diaryl-anthracene | bi-fluorene | ratio | Efficiency (cd/A) | Life (T95; hr) |
| Example 1 | H-01 | E1 | T1 | 5:5 | 5.2 | 130 |
| Example 2 | H-02 | E1 | T1 | 7:3 | 5.0 | 120 |
| Example 3 | H-03 | E1 | T2 | 5:5 | 5.1 | 120 |
| Example 4 | H-08 | E1 | T2 | 7:3 | 5.6 | 110 |
| Example 5 | H-09 | E1 | T2 | 4:6 | 5.5 | 130 |
| Example 6 | H-13 | E1 | T3 | 5:5 | 5.4 | 110 |
| Example 7 | H-14 | E1 | T5 | 5:5 | 5.5 | 120 |
| Example 8 | H-15 | E1 | T7 | 5:5 | 5.6 | 130 |
| Example 9 | H-02 | E2 | T1 | 5:5 | 5.4 | 120 |
| Example 10 | H-08 | E2 | T2 | 7:3 | 5.3 | 130 |
| Example 11 | H-13 | E2 | T2 | 3:7 | 5.1 | 100 |
| Example 12 | H-15 | E2 | T3 | 4:6 | 5.2 | 110 |
| Example 13 | H-14 | E5 | T6 | 5:5 | 5.3 | 110 |
| Example 14 | H-15 | E8 | T7 | 7:3 | 5.4 | 140 |
| Example 15 | H-14 | E9 | T4 | 5:5 | 5.5 | 120 |
| Comparative Example 1 | — | — | — | — | 3.7 | 55 |
| Comparative Example 2 | H-01 | — | — | — | 4.6 | 47 |
| Comparative Example 3 | — | E1 | — | 10:0 | 4.5 | 35 |
| Comparative Example 4 | H-15 | — | — | — | 4.4 | 50 |
| Comparative Example 5 | — | E2 | — | 10:0 | 4.7 | 60 |
| Comparative Example 6 | H-01 | — | T1 | 0:10 | 5.5 | 70 |
| Comparative Example 7 | H-15 | E1 | — | 10:0 | 3.9 | 68 |

In Table 1, an organic light emitting device according to Example 1 was manufactured by the following process, and organic light emitting devices according to Examples 2 to 15 were manufactured by conducting the same process as in Example 1 except for using different materials for the hole auxiliary layer and the electron auxiliary layer.

For the manufacture of an anode, an ITO glass substrate of 15 Ω/cm² (500 Å) of Corning Co. was used. The ITO glass substrate of Corning Co. was cut into a 50 mm×50 mm×0.5 mm size, ultrasonically washed using isopropyl alcohol and pure water for 10 minutes, respectively, exposed to ultraviolet for 10 minutes, and exposed to ozone.

After installing the substrate in a vacuum deposition apparatus, 2-TNATA was vacuum deposited on the glass substrate having the anode formed thereon to a thickness of about 600 Å to form a hole injection layer. On the hole injection layer, NPB was vacuum deposited to a thickness of about 300 Å to form a hole transport layer.

On the hole transport layer, a material for the hole auxiliary layer (compound H-01), was deposited to a thickness of about 100 Å to from a hole auxiliary layer. On the hole auxiliary layer, a host material, 2-methyl-9,10-bis (naphthalen-2-yl)anthracene (MADN) and a doping material, $N^1,N^1,N^6,N^6$-tetraphenyl-1,9-dihydropyrene-1,6-diamine) in a weight ratio of about 95:5 were applied to a thickness of about 300 Å to form an emission layer. On the emission layer, a mixture of a 9,10-diarylanthracene (compound E1) and a (bifluorene compound T-1) in weight ratio of about 5:5 was applied to a thickness of about 50 Å to form an electron auxiliary layer. Then, on the electron auxiliary layer, Alq3 was deposited to a thickness of about 300 Å to from an electron transport layer. On the electron transport layer, Al (a cathode) was vacuum deposited to a thickness of about 1,200 Å to form a cathode.

In the above Table 1, an organic light emitting device according to Comparative Example 1 was manufactured by the same method as Example 1 except for omitting the hole auxiliary layer and the electron auxiliary layer. That is, in Comparative Example 1, an anode, a hole injection layer, a hole transport layer, an emission layer, an electron transport layer, and a cathode were subsequently stacked on a substrate, and the hole auxiliary layer and the electron auxiliary layer were omitted. Organic light emitting devices according to Comparative Examples 2 and 4 were manufactured by the same method as Example 1 except for omitting the electron auxiliary layer. Organic light emitting devices according to Comparative Examples 3 and 5 were manufactured by the same method as Example 1 except for omitting the hole auxiliary layer and forming the electron auxiliary layer only using a 9,10-diarylanthracene derivative without a bifluorene derivative. An organic light emitting device according to Comparative Example 6 was manufactured by the same method as Example 1 except for omitting the 9,10-diarylanthracene derivative among the materials for the electron auxiliary layer. An organic light emitting device according to Comparative Example 7 was manufactured by the same method as Example 1 except for omitting the bifluorene derivative.

Referring to Table 1 again, the emission efficiency of the organic light emitting devices according to Examples 1 to 15 employing the hole auxiliary layer and the electron auxiliary layer according to exemplary embodiments was from about 5.0 cd/A to about 5.6 cd/A. However, the emission efficiency of the organic light emitting devices according to Comparative Examples 1 to 7 employing only one of the hole auxiliary layer and the electron auxiliary layer, or employing both of the hole auxiliary layer and the electron auxiliary layer containing only one of the 9,10-diarylanthracene derivative and the bifluorene derivative, was very low, for example, from about 3.7 cd/A to about 4.7 cd/A, except for Comparative Example 6. In addition, the life of the organic light emitting devices according to Examples 1 to 15 was at least about 100 hours, while the life of the organic light emitting devices according to Comparative Examples 1 to 7 was from at least about 35 to about 70 hours.

As described above, when an organic light emitting device is manufactured by employing the hole auxiliary layer and the electron auxiliary layer according to embodiments, high efficiency and long life may be realized.

The organic light emitting device having the above-described structure may be used in various electronic devices, for example, in lighting instruments or display apparatuses.

Figure 2:
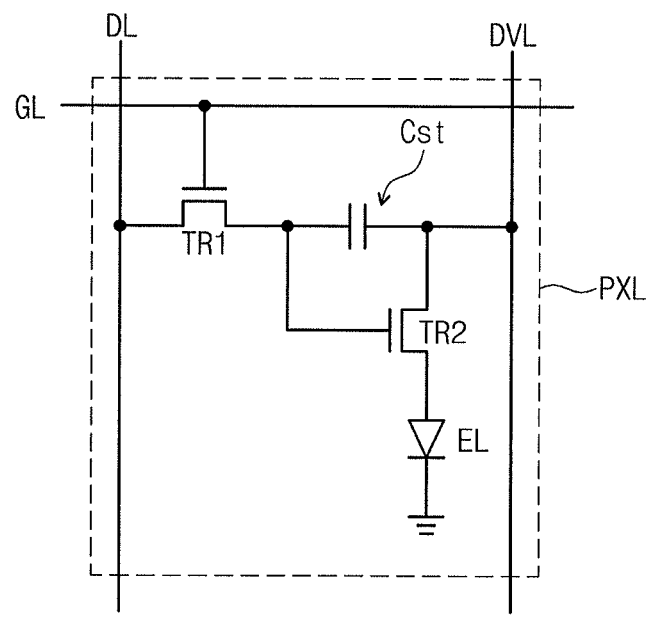
FIG. 2 illustrates a circuit diagram of a pixel when an organic light emitting device according to an embodiment is applied in a display apparatus.
Figure 3:
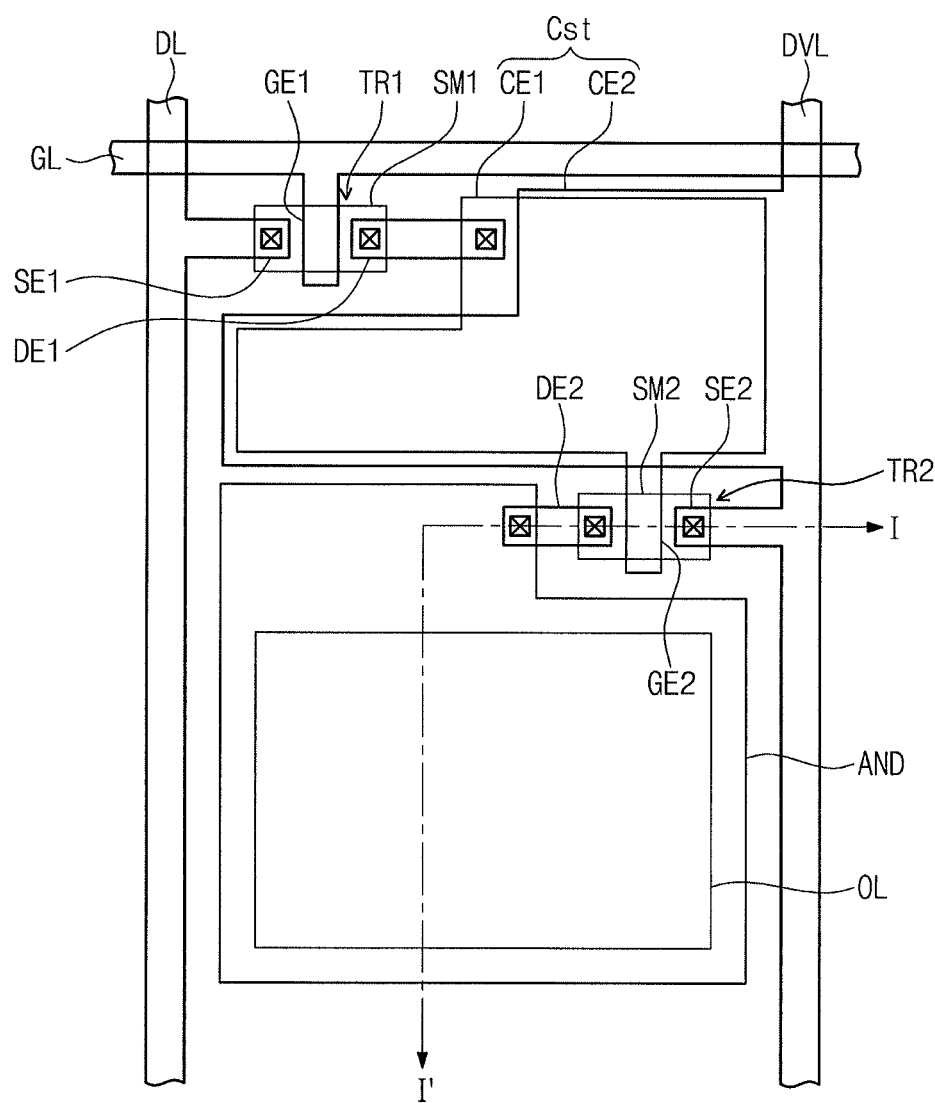
FIG. 3 illustrates a plan view of the pixel illustrated in FIG. 2.
Figure 4:
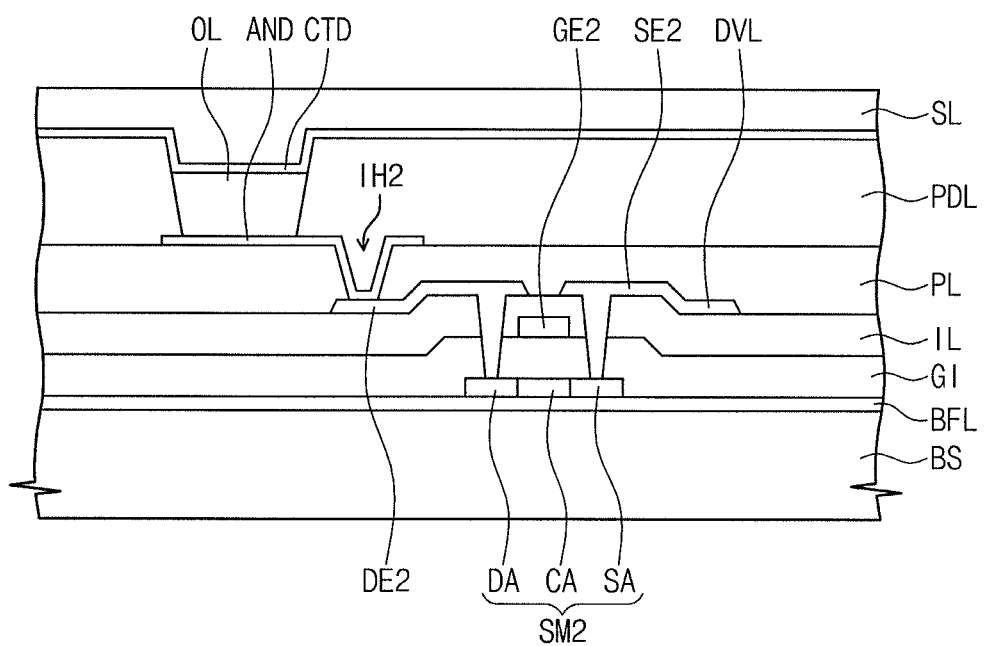
FIG. 4 illustrates a cross-sectional view cut along line I-I' in FIG. 3.

FIG. 2 illustrates a circuit diagram of a pixel when an organic light emitting device according to an embodiment is applied in a display apparatus, FIG. 3 illustrates a plan view of the pixel illustrated in FIG. 2, and FIG. 4 illustrates a cross-sectional view cut along line I-I' in FIG. 3.

Hereinafter, a display apparatus employing the organic light emitting device according to an embodiment will be explained referring to FIGS. 2 to 4.

A display apparatus according to an embodiment includes at least one pixel PXL to provide an image. A plurality of the pixels PXL may be provided and arranged in a matrix shape, however only one pixel PXL is illustrated in this embodiment for convenience of explanation.

The pixel PXL includes a wiring part including a gate line GL, a data line DL, and a driving voltage line DVL, a thin film transistor connected to the wiring part, an organic light emitting device connected to the thin film transistors, and a capacitor Cst.

The gate line GL extends one direction. The data line DL extends in another direction crossing the gate line GL. The driving voltage line DVL extends in substantially the same direction as the data line DL. The gate line GL transmits scanning signals to the thin film transistor, the data line DL transmits data signals to the thin film transistor, and the driving voltage line DVL provides a driving voltage to the thin film transistor.

The thin film transistor may include a driving thin film transistor TR2 for controlling the organic light emitting device, and a switching thin film transistor TR1 for switching the driving thin film transistor TR2. One pixel PXL may include two thin film transistors TR1 and TR2. In other implementations, one pixel PXL may be provided with one thin film transistor and one capacitor, or one pixel PXL may be provided with at least three thin film transistors and at least two capacitors, as examples.

The switching thin film transistor TR1 may include a first gate electrode GE1, a first source electrode SE1, and a first drain electrode DE1. The first gate electrode GE1 may be connected to the gate line GL, and the first source electrode SE1 may be connected to the data line DL. The first drain electrode DE1 may be connected to the gate electrode of the driving thin film transistor TR2 (that is, a second gate electrode GE2). The switching thin film transistor TR1 may transmit data signals applied to the data line DL according to the scanning signals applied to the gate line GL to the driving thin film transistor TR2.

The driving thin film transistor TR2 may include a second gate electrode GE2, a second source electrode SE2, and a second drain electrode DE2. The second gate electrode GE2 may be connected to the switching thin film transistor TR1, the second source electrode SE2 may be connected to the driving voltage line DVL, and the second drain electrode DE2 may be connected to the organic light emitting device.

The organic light emitting device includes an emission layer EML, and an anode AND and a cathode CTD facing to each other with an organic layer OL therebetween. The organic layer is illustrated as a single layer for convenience of explanation. However the organic layer may include a hole injection layer, a hole transport layer, a hole auxiliary layer, an emission layer EML, an electron auxiliary layer, an electron transport layer, and an electron injection layer stacked subsequently.

The anode AND may be connected to the second drain electrode DE2 of the driving thin film transistor TR2. A common voltage may be applied to the cathode CTD, and the organic layer OL may emit light according to the output signals of the driving thin film transistor TR2 to display images.

The capacitor Cst may be connected between the second gate electrode GE2 and the second source electrode SE2 of the driving thin film transistor TR2. The capacitor may charge and maintain data signals inputted to the second gate electrode GE2 of the driving thin film transistor TR2.

Hereinafter, the display apparatus according to an embodiment will be explained according to the stacking order.

The display apparatus according to an embodiment may include an insulating base substrate BS of glass, plastic, crystal, etc. on which a thin film transistor and an organic light emitting device are stacked.

On the base substrate BS, a buffer layer BFL may be formed. The buffer layer BFL may prevent or hinder the diffusion of impurities into switching and driving thin film transistors TR1 and TR2. The buffer layer BFL may be formed by using silicon nitride (SiNx), silicon oxide (SiOx), silicon oxynitride (SiOxNy), etc. The buffer layer BFL may be omitted according to the material of the base substrate BS and process conditions.

On the buffer layer BFL, a first semiconductor layer SM1 and a second semiconductor layer SM2 may be provided. The first semiconductor layer SM1 and the second semiconductor layer SM2 may be formed by using a semiconductor material. The first semiconductor layer SM1 and the second semiconductor layer SM2 may provide the active layer of the switching thin film transistor TR1 and the driving thin film transistor TR2, respectively. Each of the first semiconductor layer SM1 and the second semiconductor layer SM2 may include a source area SA, a drain area DA, and a channel area CA provided between the source area SA and the drain area DA. Each of the first semiconductor layer SM1 and the second semiconductor layer SM2 may be include an inorganic semiconductor or an organic semiconductor. The source area SA and the drain area DA may be doped with n-type impurities or p-type impurities.

On the first semiconductor layer SM1 and the second semiconductor layer SM2, a gate insulating layer GI may be provided.

On the gate insulating layer GI, a first gate electrode GE1 and a second gate electrode GE2 connected to the gate line GL may be provided. Each of the first gate electrode GE1 and the second gate electrode GE2 may be formed to cover an area corresponding to the channel area CA of the respective one of the first semiconductor layer SM1 and the second semiconductor layer SM2.

On the first and second gate electrodes GE1 and GE2, an interlayer dielectric IL covering the first and second gate electrodes GE1 and GE2 may be provided.

On the interlayer dielectric IL, a first source electrode SE1, a first drain electrode DE1, a second source electrode SE2 and a second drain electrode DE2 may be provided. The first source electrode SE1 and the first drain electrode DE1 may contact the source area SA and the drain area DA of the first semiconductor layer SM1, respectively, through contact holes formed in the gate insulating layer GI and the interlayer dielectric IL. The second source electrode SE2 and the second drain electrode DE2 may contact the source area SA and the drain area DA of the second semiconductor layer SM2, respectively, through contact holes formed in the gate insulating layer GI and the interlayer dielectric IL.

A passivation layer PL may be provided on the first source electrode SE1, the first drain electrode DE1, the second source electrode SE2 and the second drain electrode DE2. The passivation layer PL may serve as a passivation layer passivating the switching and driving thin film transistors TR1 and TR2 and may serve as a planarization layer planarizing the top surface thereof.

On the passivation layer PL, an anode AND may be provided as an anode of the organic light emitting device. The anode AND may be connected to the second drain electrode DE2 of the driving thin film transistor TR2 through a contact hole IH2 formed in the passivation layer PL.

On the base substrate BS on which the anode AND, etc. are formed, a pixel defining layer PDL dividing pixel areas PA may be provided so as to correspond to each pixel. The pixel defining layer PDL may expose the top surface of the anode AND and may extrude from the base substrate BS along the circumference of the pixel.

In the pixel area PA surrounded by the pixel defining layer PDL, an organic layer OL may be provided. A cathode CTD may be provided on the organic layer OL.

On the cathode CTD, a sealing layer SL covering the cathode CTD may be provided.

The organic light emitting device manufactured by the above-described method may function as a display apparatus displaying images through the recognition by a user of emitted light from the organic emission layer.

By way of summation and review, embodiments provide an organic light emitting device with high quality having improved luminous efficiency and life and a display apparatus including the same.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. An organic light emitting device, comprising:
an anode;
a hole auxiliary layer on the anode, the hole auxiliary layer including an arylamine derivative;
an emission layer on the hole auxiliary layer;
an electron auxiliary layer on the emission layer, the electron auxiliary layer including a 9,10-diarylanthracene derivative and a bifluorene derivative; and
a cathode on the electron auxiliary layer,
wherein the bifluorene derivative excludes spiro-bifluorene derivatives.

2. The organic light emitting device as claimed in claim 1, wherein a weight ratio of the 9,10-diarylanthracene derivative to the bifluorene derivative is from about 7:3 to about 3:7.

3. The organic light emitting device as claimed in claim 1, wherein the arylamine is at least one compound represented by H-01 to H-15 in the following Formula 2:

[Formula 2]

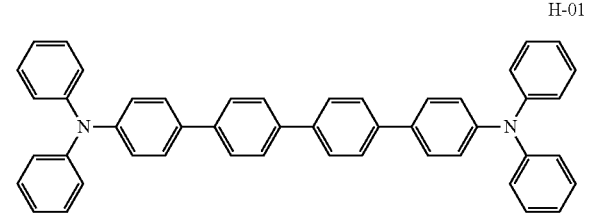

H-01

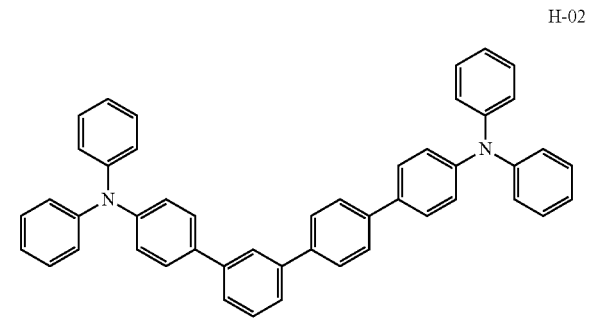

H-02

H-03
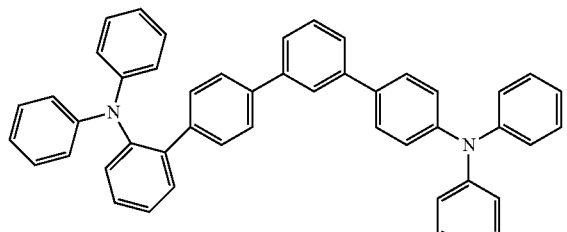
H-04
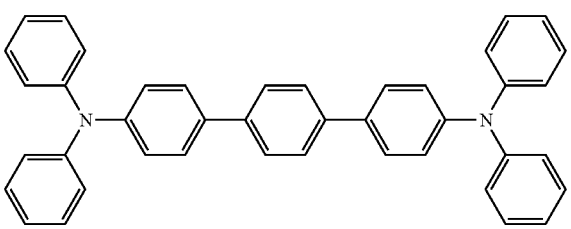
H-05
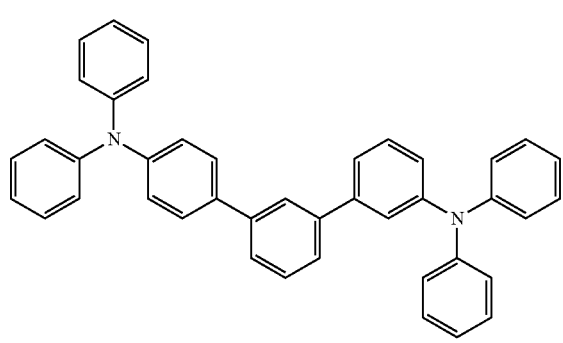
H-06
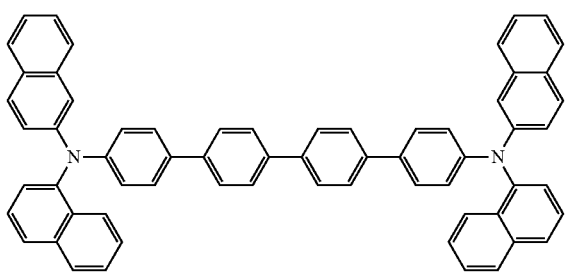
H-08
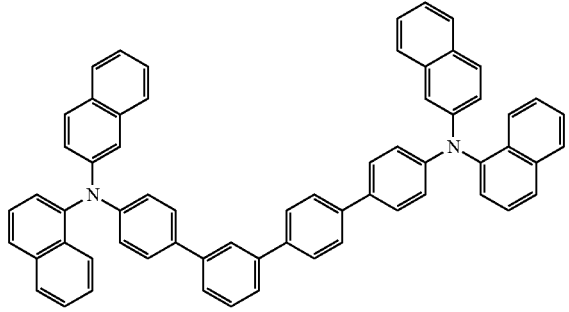
H-09
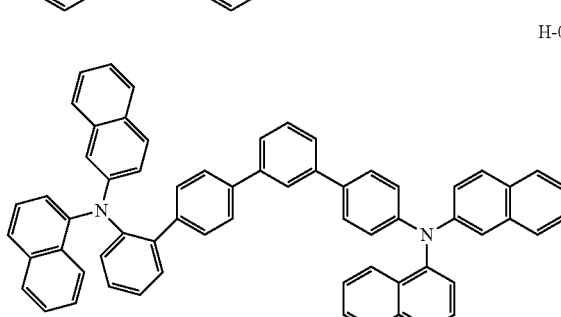
H-10
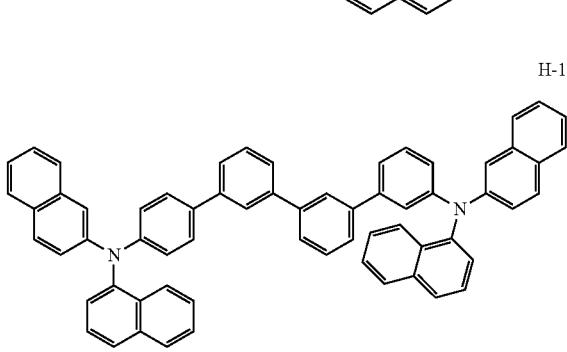
H-11
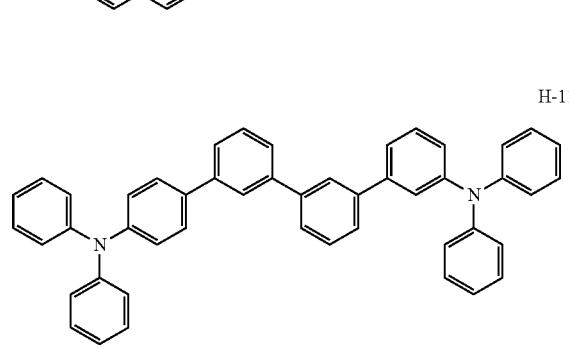
H-12
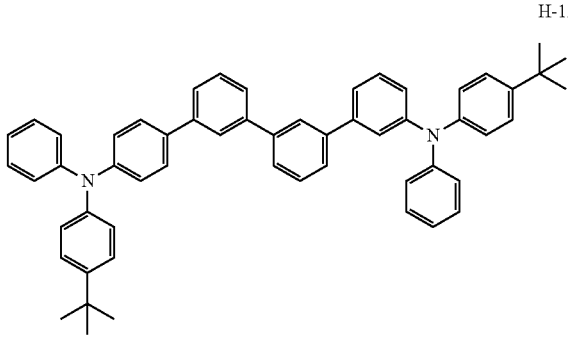

H-13

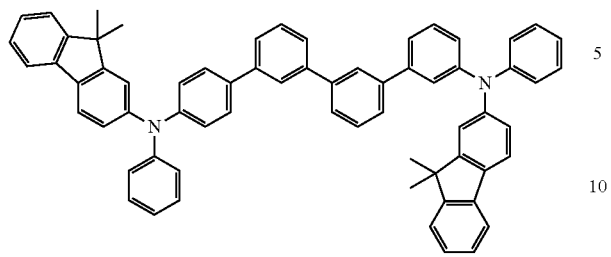

H-14

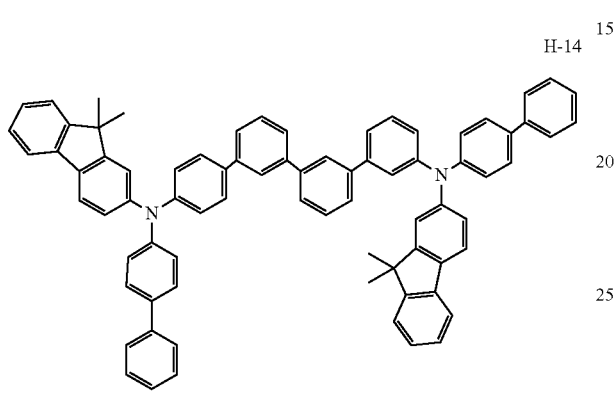

H-15

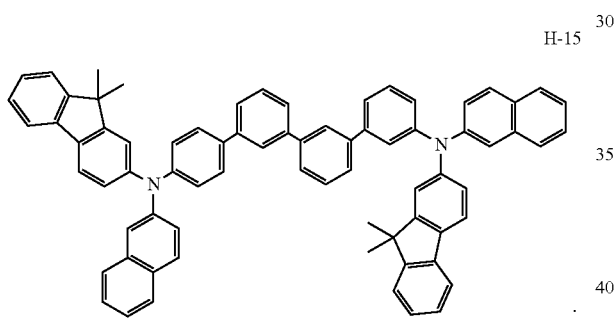

4. The organic light emitting device as claimed in claim 1, wherein the hole auxiliary layer includes an arylamine represented by the following Formula 1:

[Formula 1]

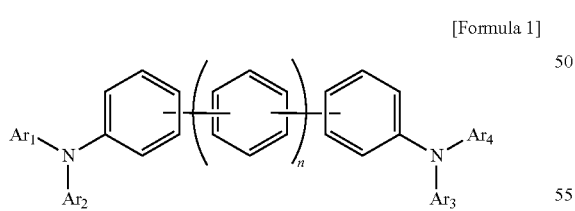

where $Ar_1$ to $Ar_4$ are independently a substituted or unsubstituted aryl group having 6 to 30 carbon atoms, a substituted or unsubstituted heteroaryl group having 2 to 30 carbon atoms, or a substituted or unsubstituted polycycloaryl group having 2 to 30 carbon atoms, and n is an integer from 2 to 4.

5. The organic light emitting device as claimed in claim 4, wherein the 9,10-diarylanthracene derivative is represented by the following Formula 3:

[Formula 3]

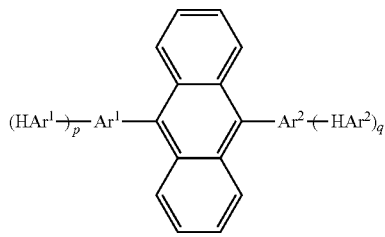

where $Ar^1$ is a substituted or unsubstituted phenylene group, $Ar^2$ is a substituted or unsubstituted phenylene group or naphthalene group, $HAr^1$ and $HAr^2$ are a substituted or unsubstituted pyridinyl group, quinolinyl group, or isoquinolinyl group, p and q are independently an integer from 0 to 3, and if p or q is at least 2, the respective groups $HAr^1$ or $HAr^2$ are the same or different.

6. The organic light emitting device as claimed in claim 5, wherein the 9,10-diarylanthracene derivative is at least one compound represented by E1 to E9 in the following Formula 4:

[Formula 4]

E1

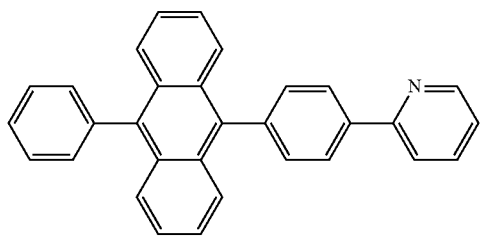

E2

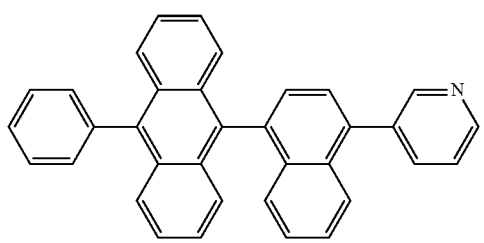

E3

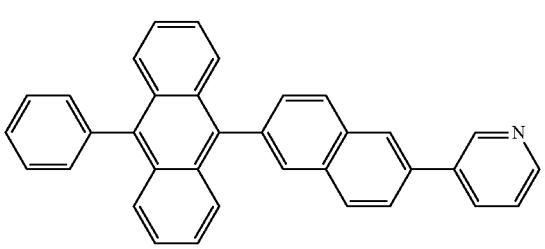

E4

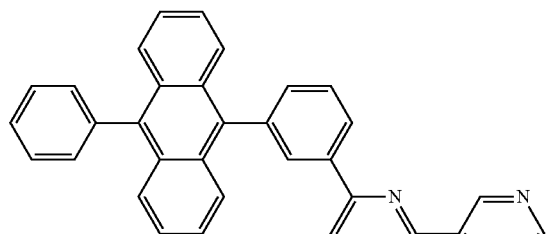

E5

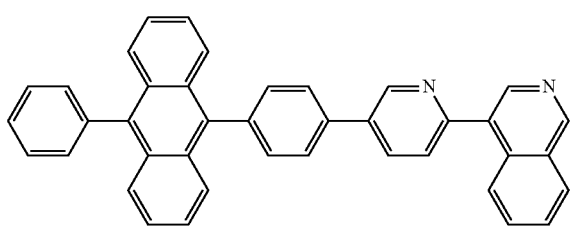

E6

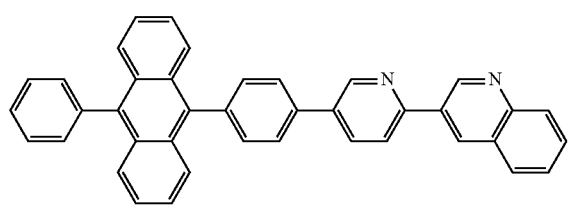

E7

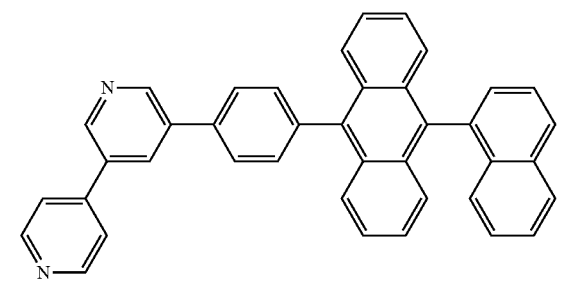

E8

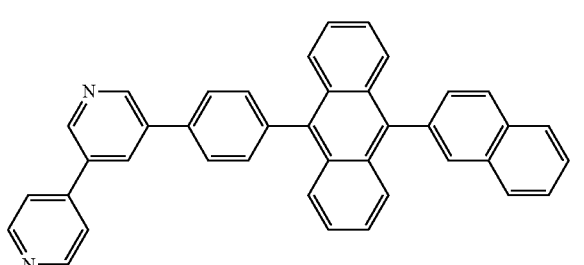

E9

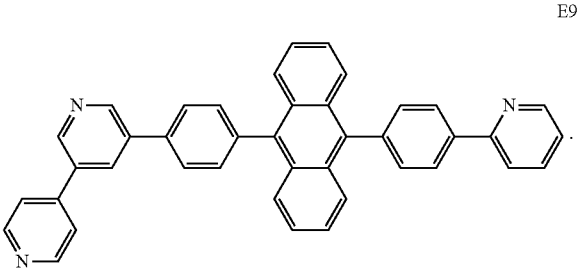

7. The organic light emitting device as claimed in claim 4, wherein the bifluorene derivative is represented by the following Formula 5:

[Formula 5]

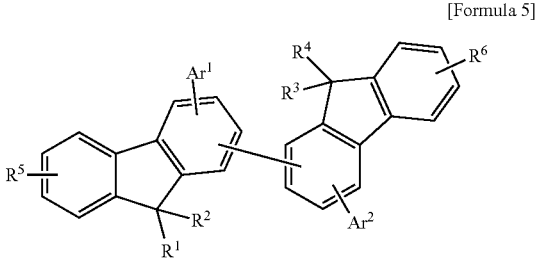

where $R^1$ to $R^6$ are independently hydrogen, deuterium, a halogen group, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted cycloalkyl group having 3 to 30 carbon atoms, a substituted or unsubstituted alkoxy group having 1 to 30 carbon atoms, a substituted or unsubstituted aryloxy group having 6 to 30 carbon atoms, a substituted or unsubstituted arylthiol group having 6 to 30 carbon atoms, a substituted or unsubstituted aryl group having 6 to 30 carbon atoms, a substituted or unsubstituted heteroaryl group having 2 to 30 carbon atoms, a substituted or unsubstituted amine group having 1 to 30 carbon atoms, a substituted or unsubstituted silyl group, a cyano group, a nitro group, a hydroxyl group, a carboxyl group, or a combination thereof, and $Ar^1$ and $Ar^2$ are independently hydrogen, deuterium, a halogen group, a substituted or unsubstituted alkyl group having 1 to 30 carbon atoms, a substituted or unsubstituted aryl group having 6 to 30 carbon atoms, a substituted or unsubstituted heteroaryl group having 2 to 30 carbon atoms, a substituted or unsubstituted amine group having 1 to 30 carbon atoms, or a combination thereof.

8. The organic light emitting device as claimed in claim 7, wherein the bifluorene derivative is at least one compound represented by T-1 to T-9 in the following Formula 6:

[Formula 6]

T-1

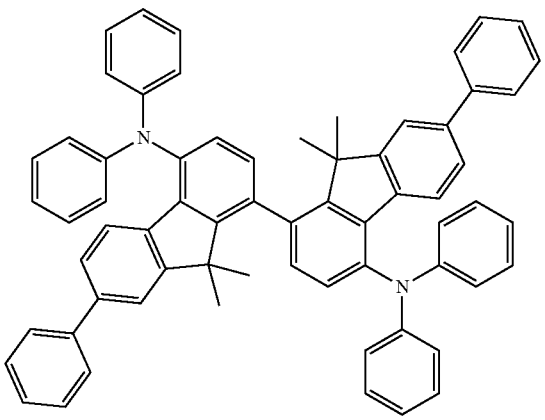

T-2
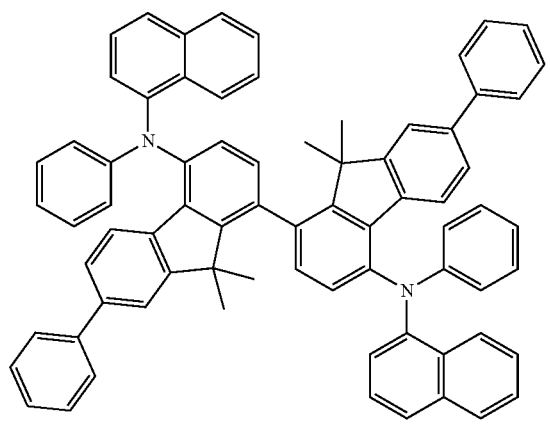
T-5
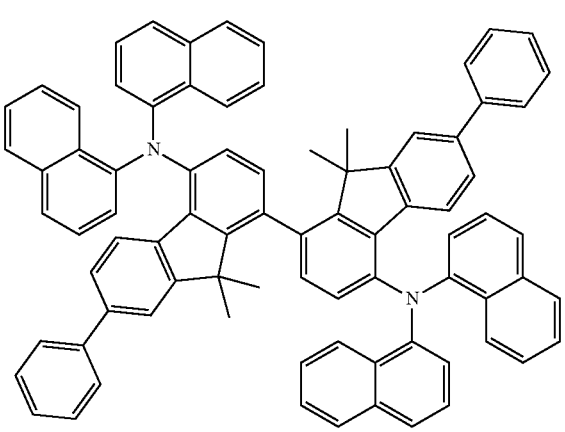
T-3
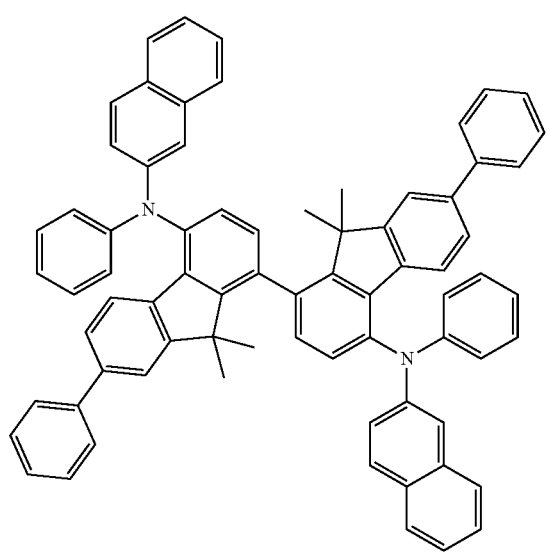
T-6
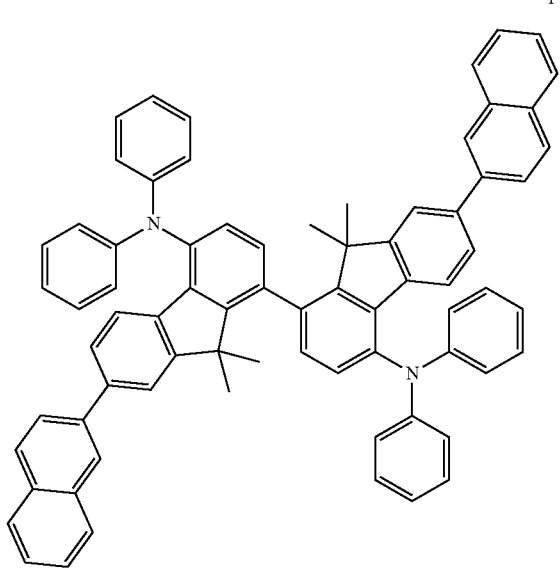
T-4
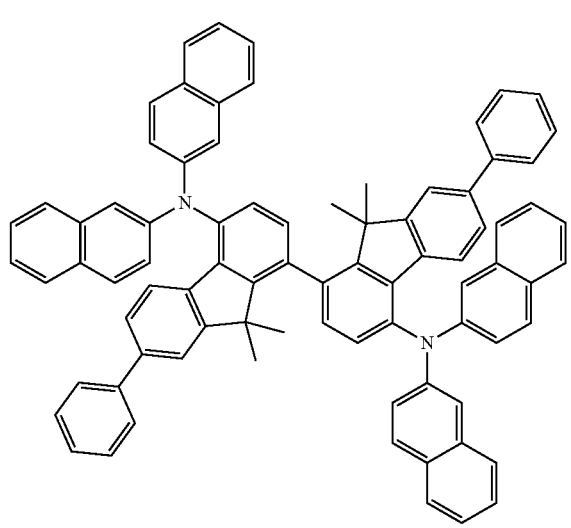
T-7
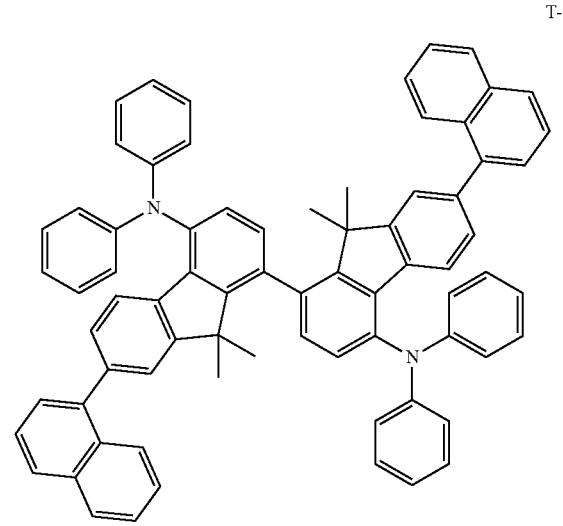

-continued

T-8

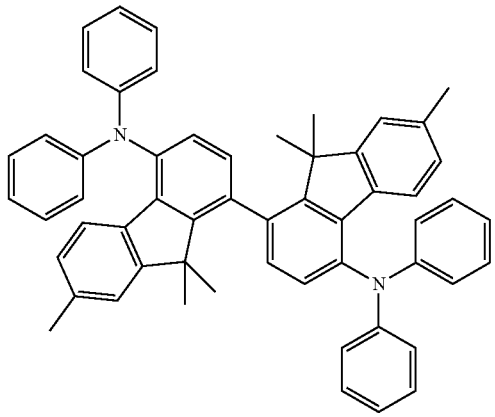

T-9

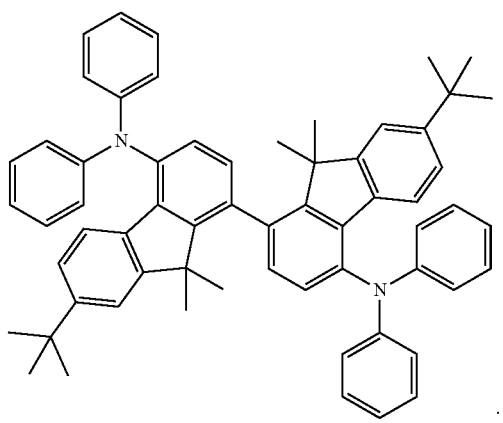

9. The organic light emitting device as claimed in claim 1, further comprising a hole transport layer between the anode and the hole auxiliary layer.

10. The organic light emitting device as claimed in claim 9, wherein the hole transport layer includes at least one of N-phenylcarbazole, polyvinylcarbazole, N,N'-bis(3-methylphenyl)-N,N'-diphenyl-[1,1-biphenyl]-4,4'-diamine (TPD), N,N'-di(1-naphthyl)-N,N'-diphenylbenzidine (NPB), 4,4', 4"-tris(N-carbazolyl)triphenylamine (TCTA), and 4,4'-cyclohexylidene bis[N,N-bis(4-methylphenyl)benzenamine (TAPC).

11. The organic light emitting device as claimed in claim 1, further comprising an electron transport layer between the electron auxiliary layer and the cathode.

12. The organic light emitting device as claimed in claim 11, wherein the electron transport layer includes at least one of tris(8-quinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalene-1-yl)-3,5-diphenyl-4H-1,2,4-triazole (NTAZ), 2-(4-biphenylyl)-5-(4-tert-butylphenyl)-1,3,4-oxadiazole (t-Bu-PBD), bis(2-methyl-8-quinolinolato-N1,O8)-(1,1'-biphenyl-4-olato) aluminum (BAlq), berylliumbis(benzoquinolin-10-olate (Bebq2), and 9,10-di(naphthalene-2-yl)anthracene (ADN).

13. An organic light emitting display apparatus, comprising:
    a wiring part;
    a thin film transistor connected to the wiring part; and
    an organic light emitting device connected to the thin film transistor,
    the light emitting device including:
        an anode;
        an emission layer on the anode;
        an electron auxiliary layer on the emission layer; and
        a cathode on the electron auxiliary layer,
    the electron auxiliary layer including a 9,10-diarylanthracene derivative and a bifluorene derivative, wherein the bifluorene derivative excludes spiro-bifluorene derivatives.

14. The organic light emitting display apparatus as claimed in claim 13, wherein an weight ratio of the 9,10-diarylanthracene derivative to the bifluorene derivative is from about 7:3 to about 3:7.

15. The organic light emitting display apparatus as claimed in claim 13, wherein the arylamine is at least one compound represented by H-1 to H-15 in the following Formula 2:

[Formula 2]

H-01

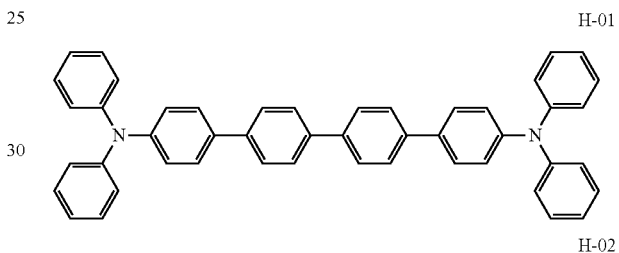

H-02

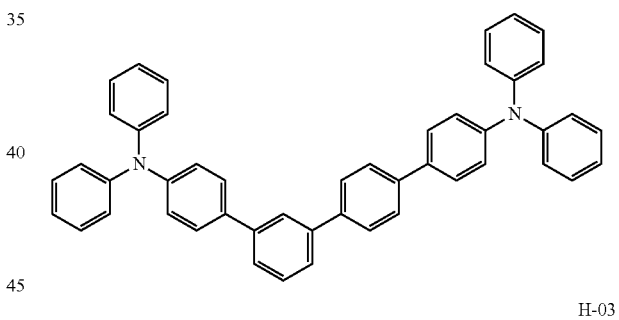

H-03

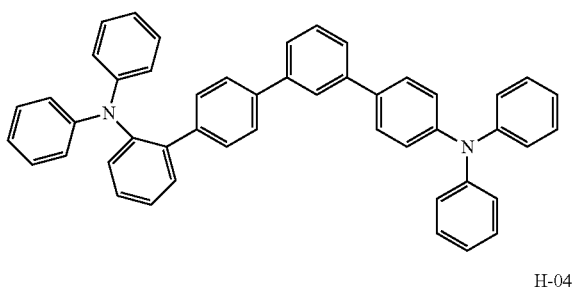

H-04

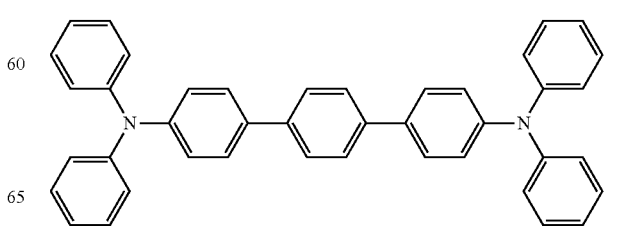

H-05
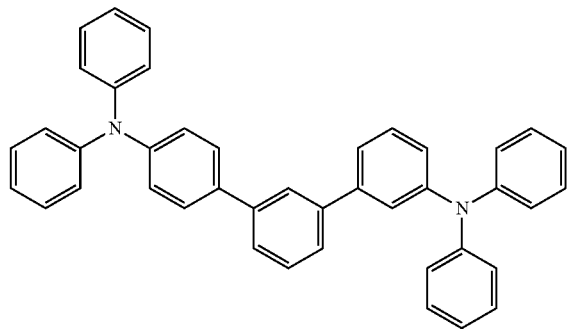
H-06
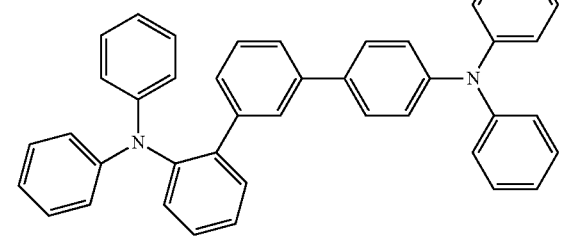
H-07
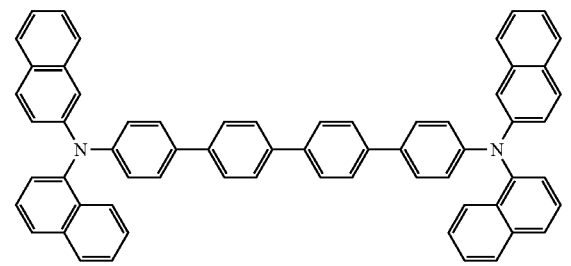
H-08
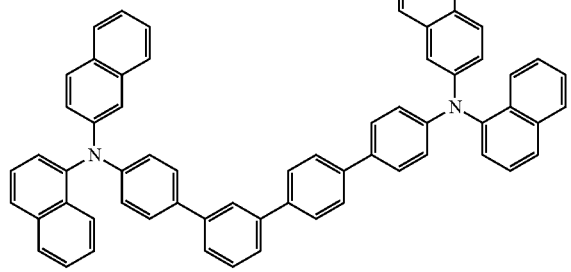
H-09
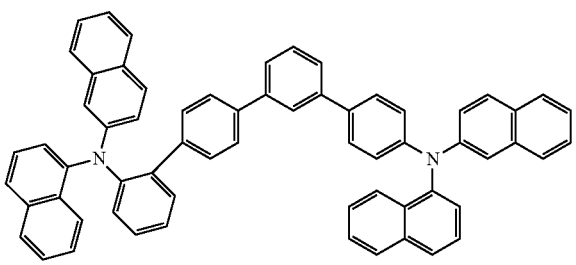
H-10
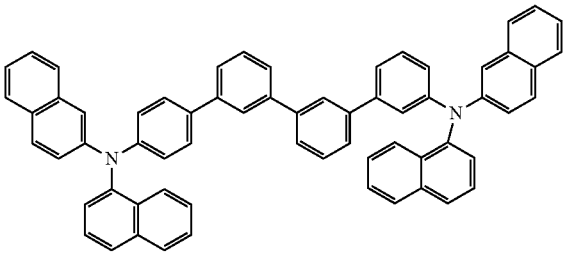
H-11
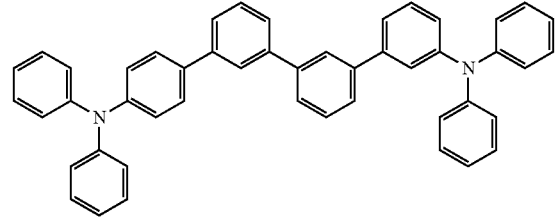
H-12
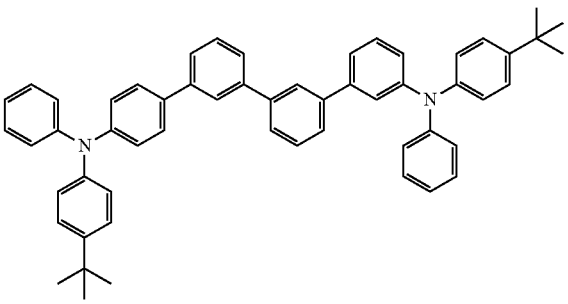
H-13
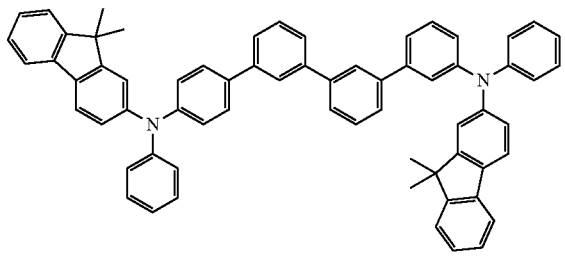
H-14
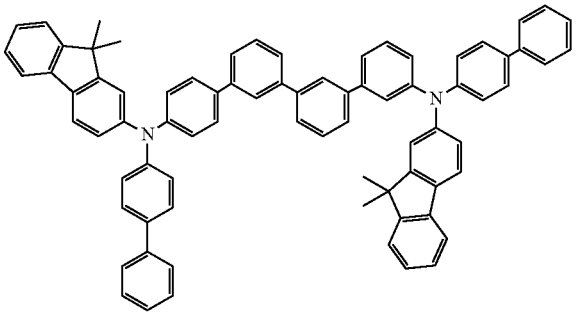

-continued

H-15

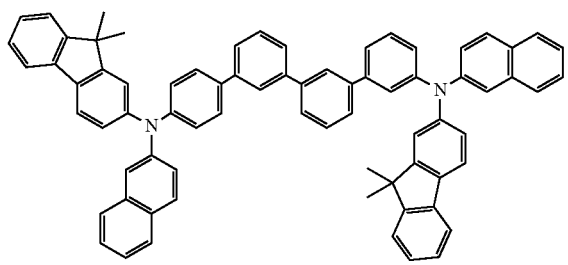

16. The organic light emitting display apparatus as claimed in claim 13, further including a hole auxiliary layer between the anode and the emission layer, the hole auxiliary layer including an arylamine represented by the following Formula 1:

[Formula 1]

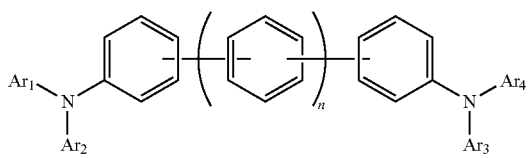

where $Ar_1$ to $Ar_4$ are independently a substituted or unsubstituted aryl group having 6 to 30 carbon atoms, a substituted or unsubstituted heteroaryl group having 2 to 30 carbon atoms, or a substituted or unsubstituted polycycloaryl group having 2 to 30 carbon atoms, and n is an integer from 2 to 4.

17. The organic light emitting display apparatus as claimed in claim 16, wherein the 9,10-diarylanthracene derivative is represented by the following Formula 3:

[Formula 3]

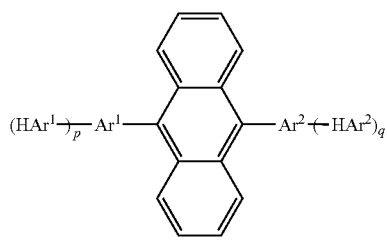

where $Ar^1$ is a substituted or unsubstituted phenylene group, $Ar^2$ is a substituted or unsubstituted phenylene group or naphthalene group, $HAr^1$ and $HAr^2$ are a substituted or unsubstituted pyridinyl group, quinolinyl group, or isoquinolinyl group, p and q are independently an integer from 0 to 3, and in the case that p or q is at least 2, the group $HAr^1$ and the group $HAr^2$ are respectively the same or different.

18. The organic light emitting display apparatus as claimed in claim 17, wherein the 9,10-diarylanthracene derivative is at least one compound represented by E1 to E9 in the following Formula 4:

[Formula 4]

E1

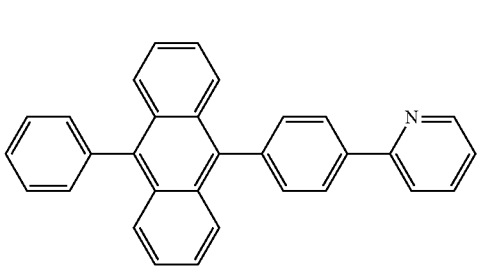

E2

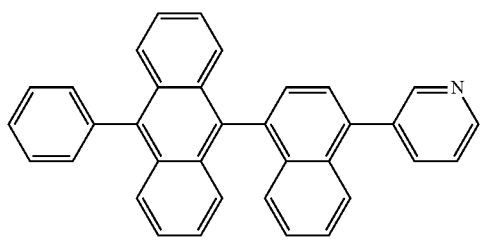

E3

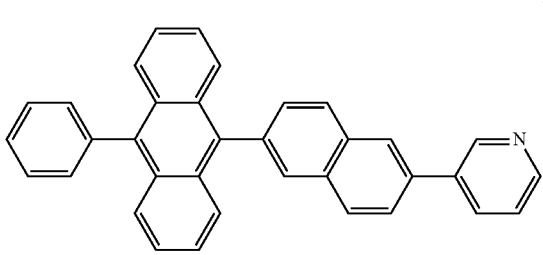

E4

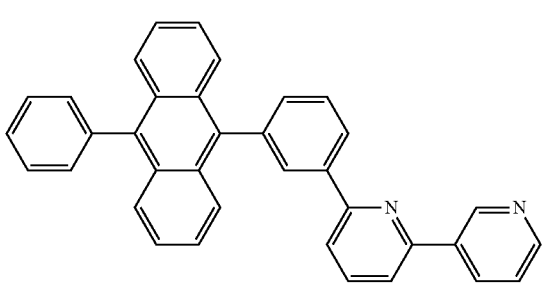

E5

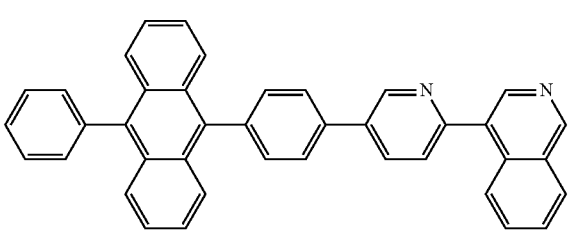

E6

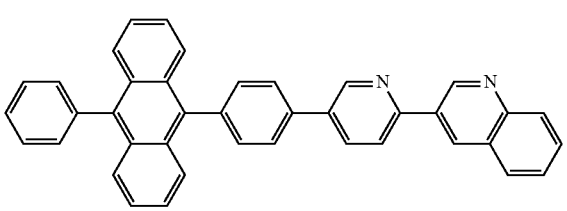

-continued

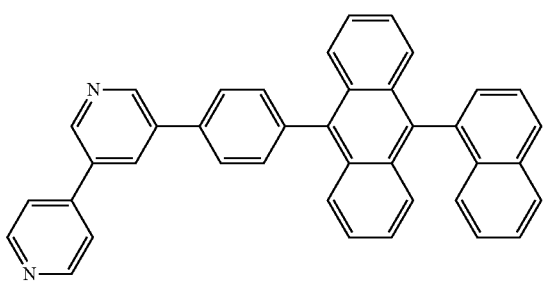
E7

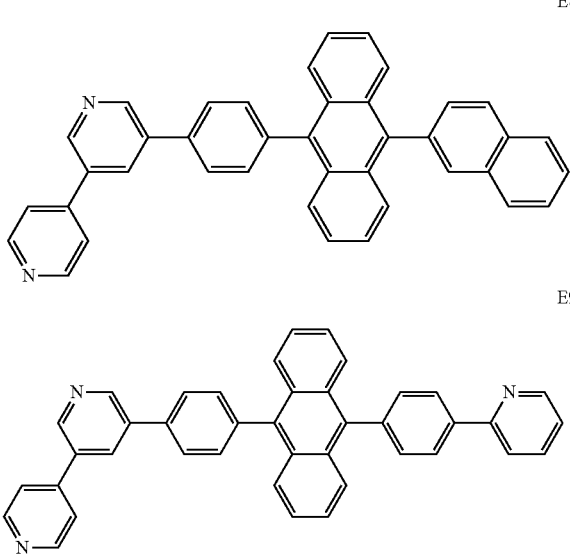
E8

E9

19. The organic light emitting display apparatus as claimed in claim 16, wherein the bifluorene derivative is represented by the following Formula 5:

[Formula 5]

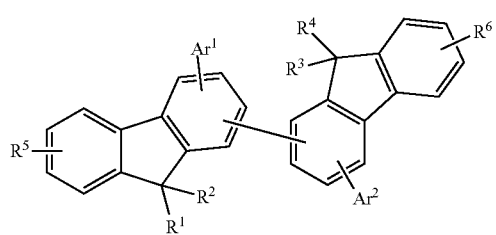

where $R^1$ to $R^6$ are independently hydrogen, deuterium, a halogen group, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted cycloalkyl group having 3 to 30 carbon atoms, a substituted or unsubstituted alkoxy group having 1 to 30 carbon atoms, a substituted or unsubstituted aryloxy group having 6 to 30 carbon atoms, a substituted or unsubstituted arylthiol group having 6 to 30 carbon atoms, a substituted or unsubstituted aryl group having 6 to 30 carbon atoms, a substituted or unsubstituted heteroaryl group having 2 to 30 carbon atoms, a substituted or unsubstituted amine group having 1 to 30 carbon atoms, a substituted or unsubstituted silyl group, a cyano group, a nitro group, a hydroxyl group, a carboxyl group, or a combination thereof, and $Ar^1$ and $Ar^2$ are independently hydrogen, deuterium, a halogen group, a substituted or unsubstituted alkyl group having 1 to 30 carbon atoms, a substituted or unsubstituted aryl group having 6 to 30 carbon atoms, a substituted or unsubstituted heteroaryl group having 2 to 30 carbon atoms, a substituted or unsubstituted amine group having 1 to 30 carbon atoms, or a combination thereof.

20. The organic light emitting display apparatus as claimed in claim 19, wherein the bifluorene derivative is at least one compound represented by T-1 to T-9 in the following Formula 6:

[Formula 6]

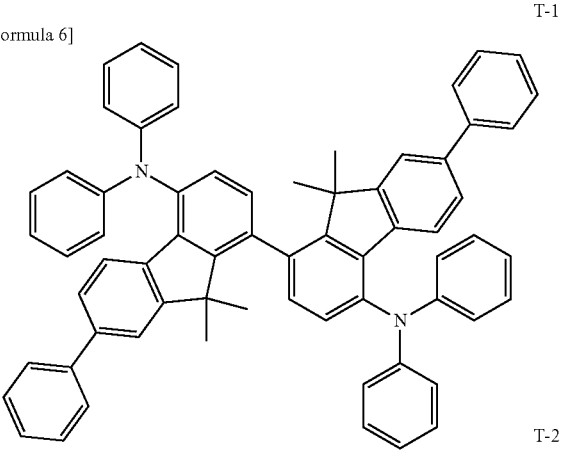
T-1

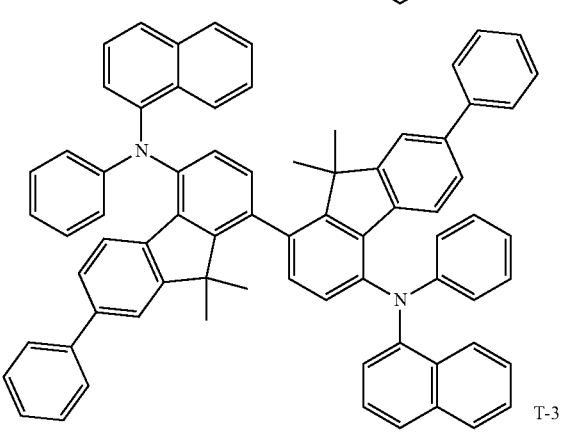
T-2

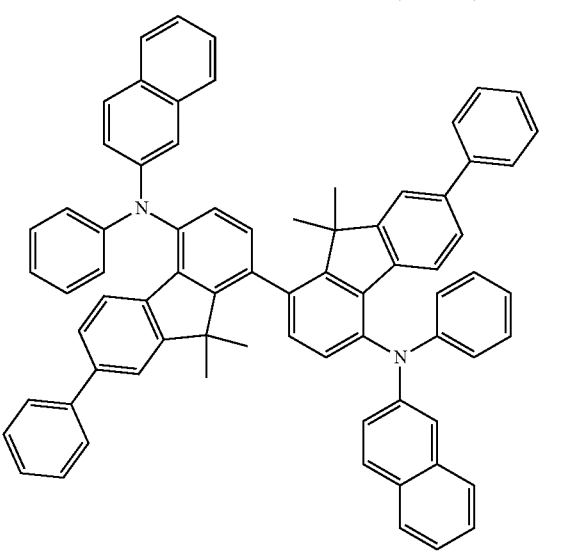
T-3

T-4
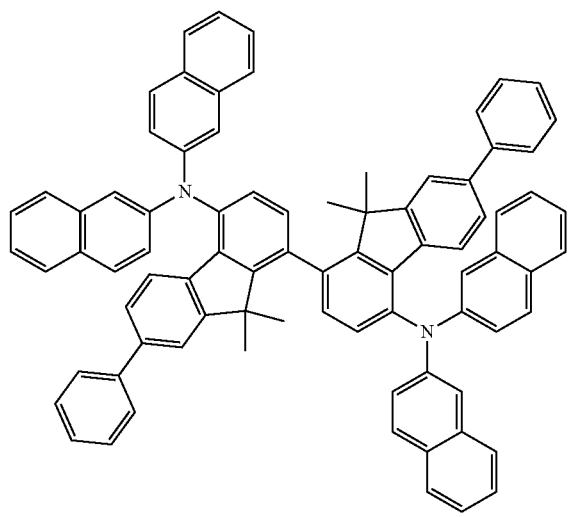
T-7
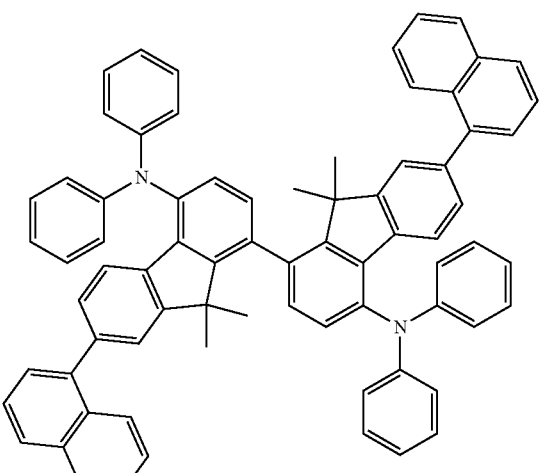
T-5
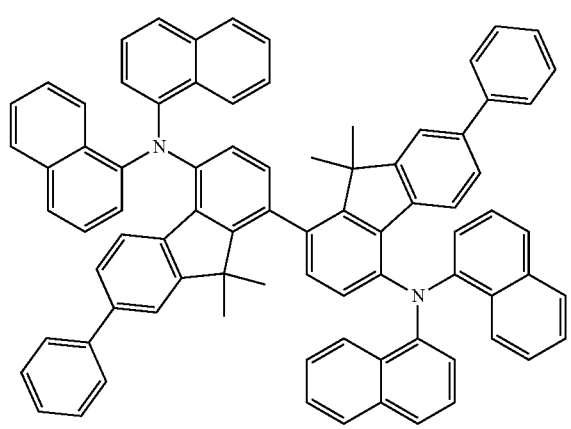
T-8
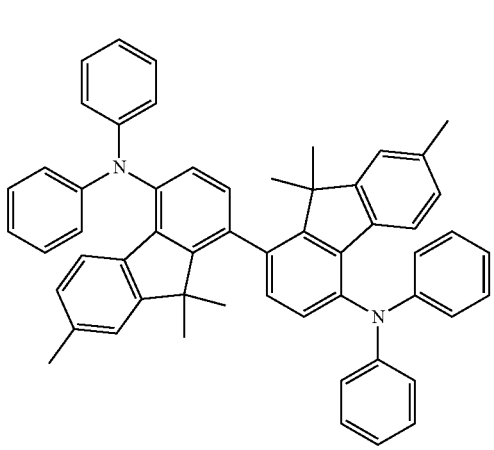
T-6
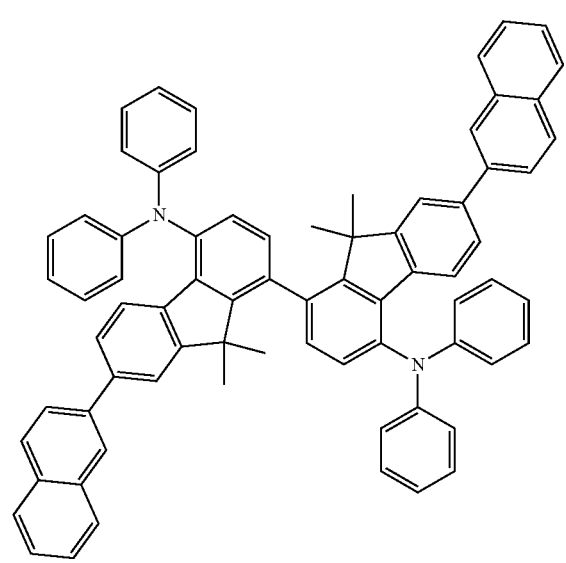
T-9
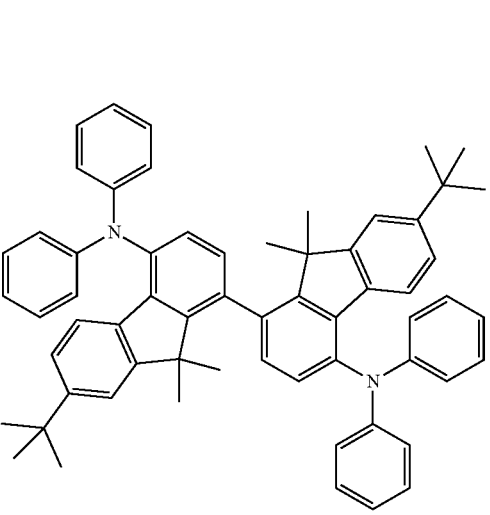
* * * * *